(12) United States Patent
Arao et al.

(10) Patent No.: US 8,415,664 B2
(45) Date of Patent: Apr. 9, 2013

(54) SEMICONDUCTOR DEVICE

(75) Inventors: Tatsuya Arao, Kanagawa-ken (JP); Daiki Yamada, Tochigi (JP); Hidekazu Takahashi, Tochigi (JP); Naoto Kusumoto, Kanagawa (JP); Kazuo Nishi, Tochigi (JP); Yuusuke Sugawara, Tochigi (JP); Hironobu Takahashi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/271,272

(22) Filed: Oct. 12, 2011

(65) Prior Publication Data

US 2012/0086006 A1 Apr. 12, 2012

Related U.S. Application Data

(63) Continuation of application No. 11/681,638, filed on Mar. 2, 2007, now Pat. No. 8,053,816.

(30) Foreign Application Priority Data

Mar. 10, 2006 (JP) ................................. 2006-065601

(51) Int. Cl.
*H01L 31/0232* (2006.01)
(52) U.S. Cl. ......................................................... 257/53
(58) Field of Classification Search .................... 257/98, 257/100, 184, 187, 257, 258, 291, 233, 292, 257/430–466, 656, E29.336; 438/48, 54, 438/65, 69, 70
See application file for complete search history.

(56) References Cited

U.S. PATENT DOCUMENTS

| | | | |
|---|---|---|---|
| 4,841,348 A | 6/1989 | Shizukuishi et al. | |
| 4,885,622 A | 12/1989 | Uchiyama et al. | |
| 5,130,829 A | 7/1992 | Shannon | |
| 6,407,415 B2 | 6/2002 | Lee | |
| 6,566,154 B2 | 5/2003 | Yamamoto | |
| 6,636,284 B2 | 10/2003 | Sato | |
| 6,747,290 B2 | 6/2004 | Yamazaki et al. | |
| 6,747,638 B2 | 6/2004 | Yamazaki et al. | |
| 6,879,361 B2 * | 4/2005 | Moon et al. ................. | 349/114 |
| 7,030,551 B2 | 4/2006 | Yamazaki et al. | |
| 7,335,951 B2 | 2/2008 | Nishi et al. | |
| 7,442,994 B2 * | 10/2008 | Ha ................................ | 257/347 |

(Continued)

FOREIGN PATENT DOCUMENTS

| | | |
|---|---|---|
| JP | 03-268369 A | 11/1991 |
| JP | 04-124883 A | 4/1992 |

(Continued)

*Primary Examiner* — Marcos D. Pizarro
*Assistant Examiner* — Sue Tang
(74) *Attorney, Agent, or Firm* — Fish & Richardson P.C.

(57) ABSTRACT

Techniques are provided for obtaining a photoelectric conversion device having a favorable spectral sensitivity characteristic and reduced variation in output current without a contamination substance mixed into a photoelectric conversion layer or a transistor, and for obtaining a highly reliable semiconductor device including a photoelectric conversion device. A semiconductor device may include, over an insulating surface, a first electrode; a second electrode; a color filter between the first electrode and the second electrode; an overcoat layer covering the color filter; and a photoelectric conversion layer over the overcoat layer, where one end portion of the photoelectric conversion layer is in contact with the first electrode, and where an end portion of the color filter lies inside the other end portion of the photoelectric conversion layer.

18 Claims, 21 Drawing Sheets

| U.S. PATENT DOCUMENTS | | | | FOREIGN PATENT DOCUMENTS | | |
|---|---|---|---|---|---|---|
| 2005/0082463 A1 | 4/2005 | Koyama et al. | | JP | 05-218374 A | 8/1993 |
| 2005/0167709 A1 | 8/2005 | Augusto | | JP | 09-096807 A | 4/1997 |
| 2006/0061702 A1 | 3/2006 | Seo et al. | | JP | 2005-129909 A | 5/2005 |
| 2006/0261253 A1 | 11/2006 | Arao et al. | | | | |
| 2006/0267054 A1* | 11/2006 | Martin et al. | 257/291 | * cited by examiner | | |

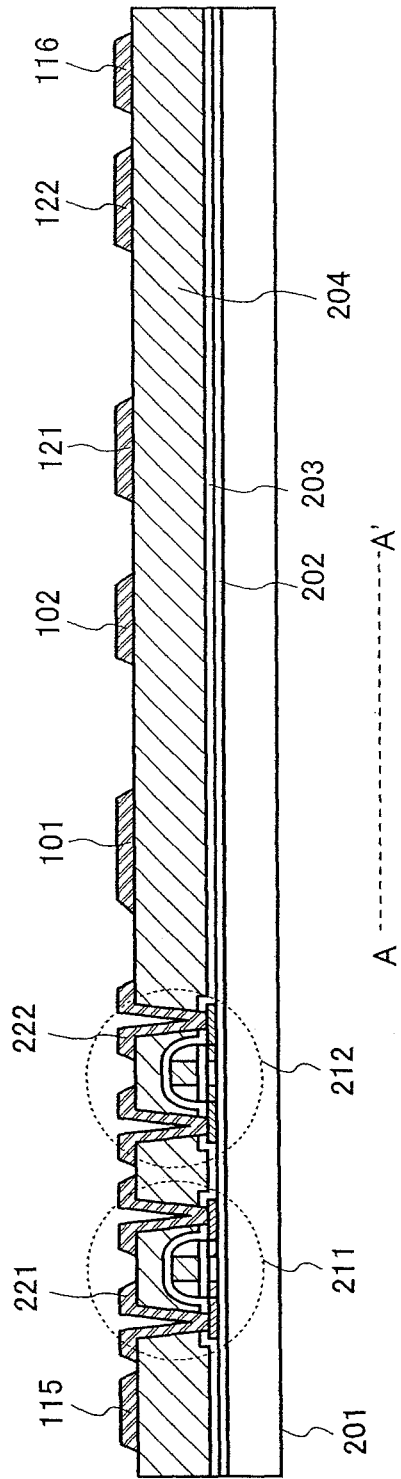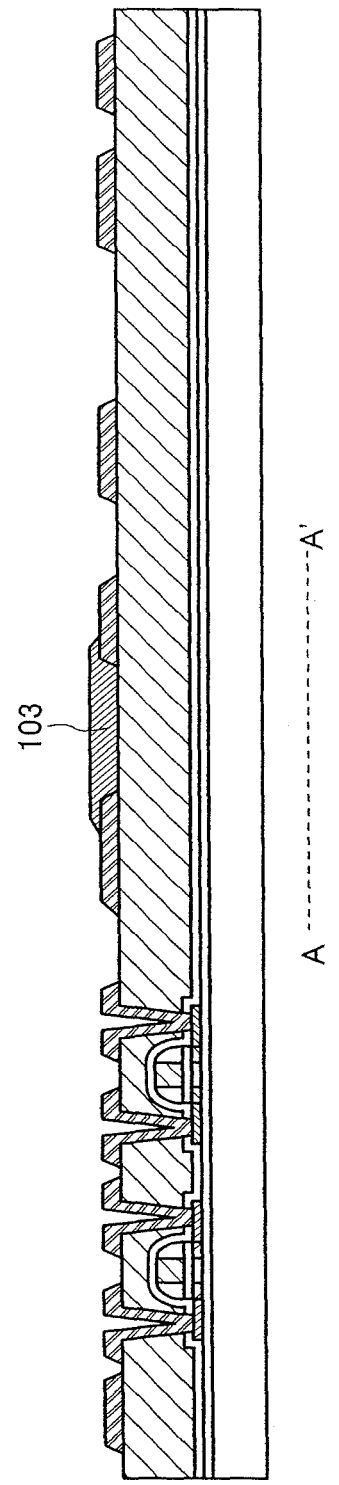
FIG. 2A
FIG. 2B

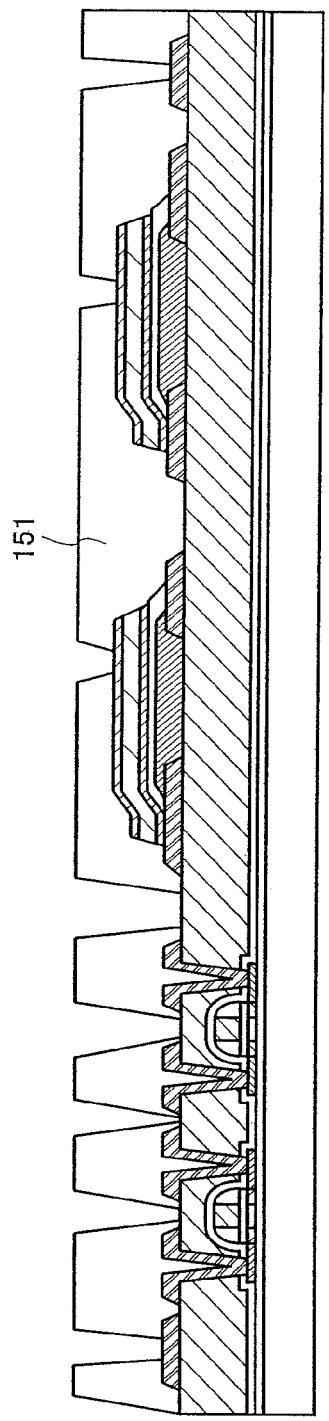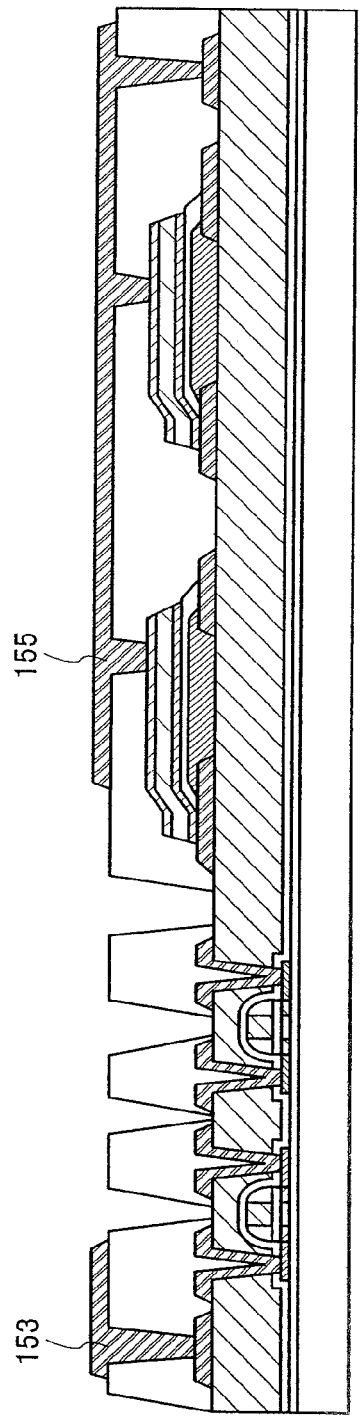

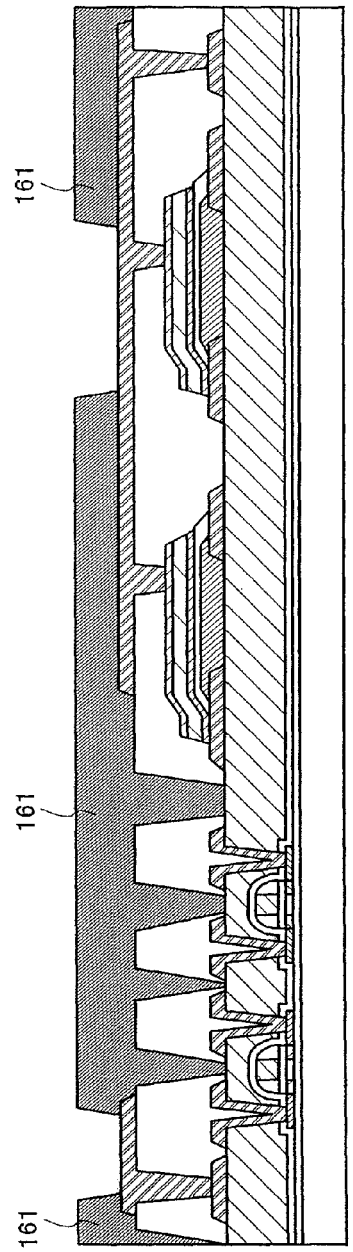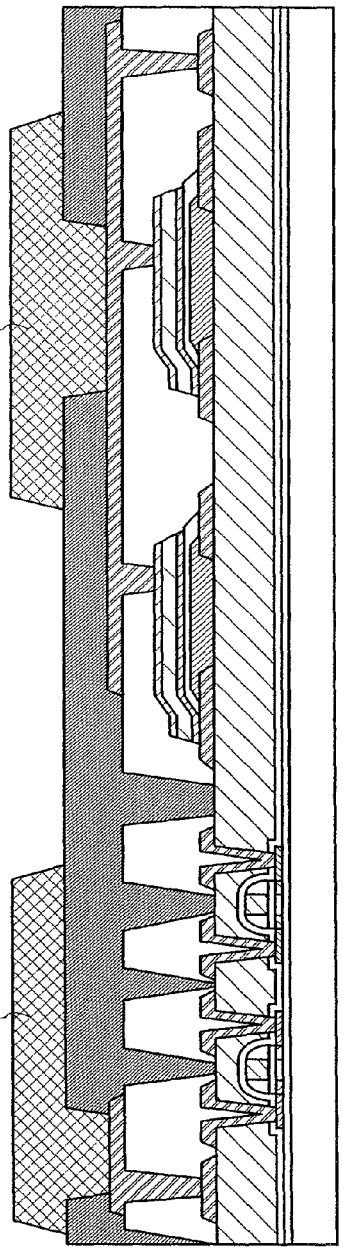

SEMICONDUCTOR DEVICE

CROSS-REFERENCE TO RELATED APPLICATIONS

This application is a continuation of U.S. application Ser. No. 11/681,638, filed Mar. 2, 2007, now allowed, which claims the benefit of a foreign priority application filed in Japan as Serial No. 2006-065601 on Mar. 10, 2006, both of which are incorporated by reference.

BACKGROUND OF THE INVENTION

1. Field of the Invention

The present invention relates to a photoelectric conversion device that outputs light received into an electrical signal and a semiconductor device having the photoelectric conversion device.

2. Description of the Related Art

As a photoelectric conversion device used for detecting an electromagnetic wave, ones having sensitivity in the ultraviolet light region to infrared light region are also referred to as light sensors, in general. Among general light sensors, one having sensitivity in a visible light ray region of a wavelength of 400 to 700 nm is referred to as a visible light sensor, which is variously used for equipment that needs illuminance adjustment or on-off control depending on the living environment (see Patent Document 1: Japanese Published Patent Application No. 2005-129909).

When a color sensor is manufactured with the use of single-crystalline silicon (Si), a color filter is provided on an uppermost surface of a single-crystalline silicon substrate because light is received on the surface side of the substrate. In addition, a color sensor using single-crystalline silicon prevents absorption of an infrared ray with the use of an infrared ray cut filter and is manufactured to have desired spectral sensitivity in many cases.

On the other hand, when the sensor is manufactured using amorphous silicon (a-Si), since an amorphous silicon film can be formed over a substrate, light can enter not only from the substrate surface side but also from the substrate side. In other words, since light can be received by the sensor by transmission through the substrate, light can be introduced into the sensor efficiently. Therefore, an extraction electrode can be provided on another surface of an incidence surface; therefore, the sensor is miniaturized easily. In addition, since an amorphous silicon film hardly absorbs infrared light, it is not necessary to provide the infrared ray cut filter. However, when the color sensor is manufactured using an amorphous silicon film, a color filter is interposed between a photoelectric conversion layer formed of an amorphous silicon film and a substrate.

SUMMARY OF THE INVENTION

A color filter used in manufacturing a color sensor contains a substance that causes metallic contamination of copper (Cu), sodium (Na), potassium (K), or the like. Contamination prevention is necessary so that such a substance does not mix into a photoelectric conversion layer or a transistor of the sensor.

It is an object of the present invention to obtain a photoelectric conversion device having a favorable spectral sensitivity characteristic and no variation in output current without such a contamination substance being mixed into a photoelectric conversion layer or a transistor. Further, it is another object of the present invention to obtain a highly reliable semiconductor device in a semiconductor device having such a photoelectric conversion device.

In a photoelectric conversion device provided with a color filter, measures against contamination can be taken by an overcoat layer being provided.

However, when the overcoat layer is made to disappear by etching or the like in a subsequent step, there is a possibility that a contamination substance will be diffused into a photoelectric conversion layer.

In addition, when a color filter is provided only in an inside region of a photoelectric conversion layer and an overcoat layer is formed thereover in order to prevent diffusion of a contamination substance, light that does not pass through the color filter enters a region between the end portion of the overcoat layer and the end portion of the photoelectric conversion layer. Even such light is detected; therefore, a spectral sensitivity characteristic of a photoelectric conversion device deteriorates.

Moreover, it is necessary to particularly suppress variation in the color sensor depending on its usage. However, when an amorphous silicon film is formed as a photoelectric conversion layer with a pattern using a printing method, the area of the amorphous silicon film is likely to have variation, which results in variation in output value.

In the present invention, a light-shielding layer of metal is provided between the photoelectric conversion layer of the amorphous silicon film and a substrate so that only the vicinity of the end portion of the photoelectric conversion layer is covered with the light-shielding layer. In order to form the light-shielding layer, a photolithography method or the like having a design rule which is more detailed than that of a printing method is employed so that variation in incidence light can be suppressed to the level of variation in photolithography.

Further, in the present invention, a color filter is provided in all regions where at least light is transmitted, and a region lying inside the end portion of the photoelectric conversion layer. In addition, an overcoat layer is formed to cover the color filter. The overcoat layer may be formed so as to be in contact with all under surfaces and at least a portion in contact with an electrode of the photoelectric conversion layer. Accordingly, in an etching step of the amorphous silicon film which is the photoelectric conversion layer or in subsequent steps thereof, the color filter can keep a state of being covered with the overcoat layer even when the overcoat layer is etched by over etching; thus, contamination can be prevented.

If necessary, a passivation film may be formed over the overcoat layer so as to suppress a contamination substance from mixing into the photoelectric conversion layer. Alternatively, a passivation film may be formed between the color filter and a gate insulating film of a transistor so as to prevent a contamination substance from mixing into the transistor. The passivation film may be formed using silicon nitride, silicon oxide, silicon oxide containing nitrogen, or silicon nitride containing oxygen.

According to one feature of the present invention, a photoelectric conversion device includes a light-shielding layer; and a photoelectric conversion layer having a first semiconductor layer of one conductivity type, a second semiconductor layer, and a third semiconductor layer of an opposite conductivity type from that of the first semiconductor layer. The light-shielding layer shields at least an end portion of the photoelectric conversion layer from light.

According to another feature of the present invention, a photoelectric conversion device includes a thin film transistor; a light-shielding layer; and a photoelectric conversion layer having a first semiconductor layer of one conductivity type, a second semiconductor layer, and a third semiconductor layer of an opposite conductivity type from that of the first semiconductor layer. The light-shielding layer shields at least an end portion of the photoelectric conversion layer from light.

In the present invention, the light-shielding layer is formed of a first electrode, and the first electrode and the first semiconductor layer are in contact with each other electrically.

In the present invention, the light-shielding layer is formed of a second electrode, and the second electrode and the photoelectric conversion layer are not in contact with each other due to an insulating material interposed therebetween.

In the present invention, the light-shielding layer shields at least a channel portion of the thin film transistor from light.

According to another feature of the present invention, a photoelectric conversion device includes a light-shielding layer; a color filter; an overcoat layer covering the color filter; a photoelectric conversion layer having a first semiconductor layer of one conductivity type, a second semiconductor layer, and a third semiconductor layer of an opposite conductivity type from that of the first semiconductor layer, over the overcoat layer. The light-shielding layer shields at least end portions of the photoelectric conversion layer, the color filter, and the overcoat layer from light.

According to another feature of the present invention, a photoelectric conversion device includes a thin film transistor; a light-shielding layer; a color filter; an overcoat layer covering the color filter; a photoelectric conversion layer having a first semiconductor layer of one conductivity type, a second semiconductor layer, and a third semiconductor layer of an opposite conductivity type from that of the first semiconductor layer, over the overcoat layer. The light-shielding layer shields at least end portions of the photoelectric conversion layer, the color filter, and the overcoat layer from light.

In the present invention, a passivation layer is formed between a gate insulating film of the thin film transistor and the color filter.

In the present invention, the passivation layer is any one of silicon nitride, silicon oxide, silicon oxide containing nitrogen, and silicon nitride containing oxygen.

In the present invention, the light-shielding layer shields at least a channel portion of the thin film transistor from light.

In the present invention, the end portion of the photoelectric conversion layer lies outside the end portion of the color filter.

In the present invention, the end portion of the overcoat layer lies outside the end portion of the photoelectric conversion layer.

In the present invention, the light-shielding layer has conductivity, and the light-shielding layer and the first semiconductor layer are in contact with each other electrically.

In the present invention, the light-shielding layer has conductivity, and the light-shielding layer and the photoelectric conversion layer are not in contact with each other due to an insulating material interposed therebetween.

In the present invention, the overcoat layer is formed of an organic resin insulating material, an inorganic insulating material, or a stacked layer of an organic insulating material and an inorganic insulating material.

In the present invention, the organic resin insulating material used in the photoelectric conversion device is acrylic or polyimide.

In the present invention, the inorganic insulating material is any one of silicon nitride, silicon oxide, silicon oxide containing nitrogen, and silicon nitride containing oxygen.

In the present invention, each of the first semiconductor layer, the second semiconductor layer, and the third semiconductor layer is an amorphous semiconductor layer or a semi-amorphous semiconductor layer.

According to another feature of the present invention, a photoelectric conversion device includes, over an insulating surface, a first electrode; a second electrode; a color filter between the first electrode and the second electrode; an overcoat layer covering the color filter; and a photoelectric conversion layer having a first semiconductor layer of one conductivity type, a second semiconductor layer, and a third semiconductor layer of an opposite conductivity type from that of the first semiconductor layer, over the overcoat layer. One end portion of the photoelectric conversion layer is in contact with the first electrode, and an end portion of the color filter lies inside the other end portion of the photoelectric conversion layer.

In the present invention, the insulating surface is a substrate surface, and the substrate is a light-transmitting glass substrate or flexible substrate.

In the present invention, the insulating surface is a surface of an insulating film which is provided over a substrate, and the insulating film is any one of a silicon oxide film, a silicon nitride film, a silicon oxide film containing nitrogen, and a silicon nitride film containing oxygen.

According to another feature of the present invention, a semiconductor device includes, over a substrate, a thin film transistor having an active layer, a gate insulating film, a gate electrode, and source and drain electrodes; an interlayer insulating film covering the active layer, the gate insulating film, and the gate electrode of the thin film transistor; a first electrode and a second electrode formed over the interlayer insulating film; a color filter between the first electrode and the second electrode; an overcoat layer covering the color filter; and a photoelectric conversion layer having a first semiconductor layer of one conductivity type, a second semiconductor layer, and a third semiconductor layer of an opposite conductivity type from that of the first semiconductor layer, over the overcoat layer. One end portion of the photoelectric conversion layer is in contact with the first electrode; and an end portion of the color filter lies inside the other end portion of the photoelectric conversion layer.

In the present invention, the substrate is a light-transmitting glass substrate or flexible substrate.

In the present invention, the overcoat layer is a light-transmitting organic resin insulating material.

In the present invention, the light-transmitting organic resin insulating material is acrylic or polyimide.

In the present invention, the overcoat layer is a light-transmitting inorganic insulating material.

In the present invention, the light-transmitting inorganic insulating material is any one of silicon nitride, silicon oxide, silicon oxide containing nitrogen, and silicon nitride containing oxygen.

In the present invention, each of the first to third semiconductor layers is an amorphous semiconductor layer or a semi-amorphous semiconductor layer.

Note that, in this specification, a semiconductor device refers to an element and device which functions by use of a semiconductor in general, and an electro-optic device including a liquid crystal display device or the like and an electronic device mounted with the electro-optic device are included in the category of the semiconductor device. In other words, in this specification, the electro-optic device is also included in the category of the semiconductor device.

By shielding of incident light with a lower electrode, variation in light that enters a photodiode is suppressed so that variation in output current can be consequently reduced.

Also, when over etching occurs in a process, contamination of a color filter can be prevented, and further, element characteristics can be improved because favorable spectral sensitivity can be obtained.

BRIEF DESCRIPTION OF DRAWINGS

In the accompanying drawings:

FIGS. 2A and 2B are views each showing a manufacturing process of a semiconductor device having a photoelectric conversion device of the present invention;

FIGS. 4A and 4B are views each showing a manufacturing process of a semiconductor device having a photoelectric conversion device of the present invention;

FIGS. 5A and 5B are views each showing a manufacturing process of a semiconductor device having a photoelectric conversion device of the present invention;

DETAILED DESCRIPTION OF THE INVENTION

Figure 1:
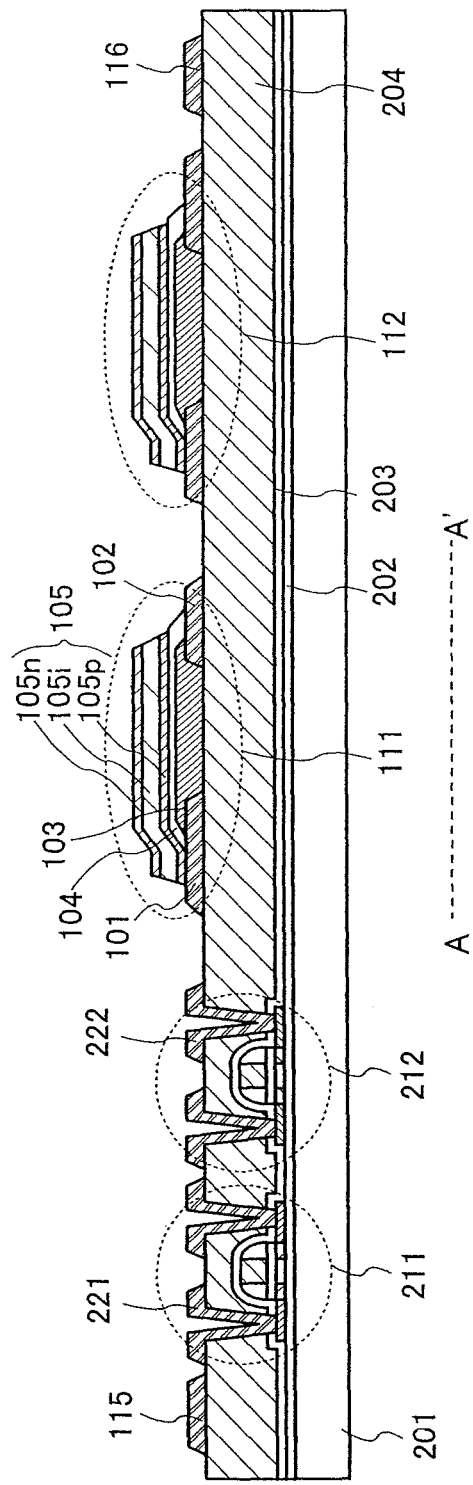
FIG. 1 is a view showing a manufacturing process of a semiconductor device having a photoelectric conversion device of the present invention.

However, the present invention is not limited to the following explanation, and it is to be easily understood that various changes and modifications will be apparent to those skilled in the art. Therefore, unless such changes and modifications depart from the purpose and the scope of the present invention, they should be construed as being included therein. Note that a reference numeral denoting the same portion in all figures is used in common in the structure of the present invention which will be explained below.

[Embodiment Mode 1]

This embodiment mode will be explained with reference to FIG. 1, FIGS. 2A and 2B, FIGS. 3A and 3B, FIGS. 4A and 4B, FIGS. 5A and 5B, FIG. 6, FIG. 7, FIGS. 8A and 8B, FIGS. 9A and 9B, FIG. 12, and FIGS. 18A to 18D.

Figure 6:
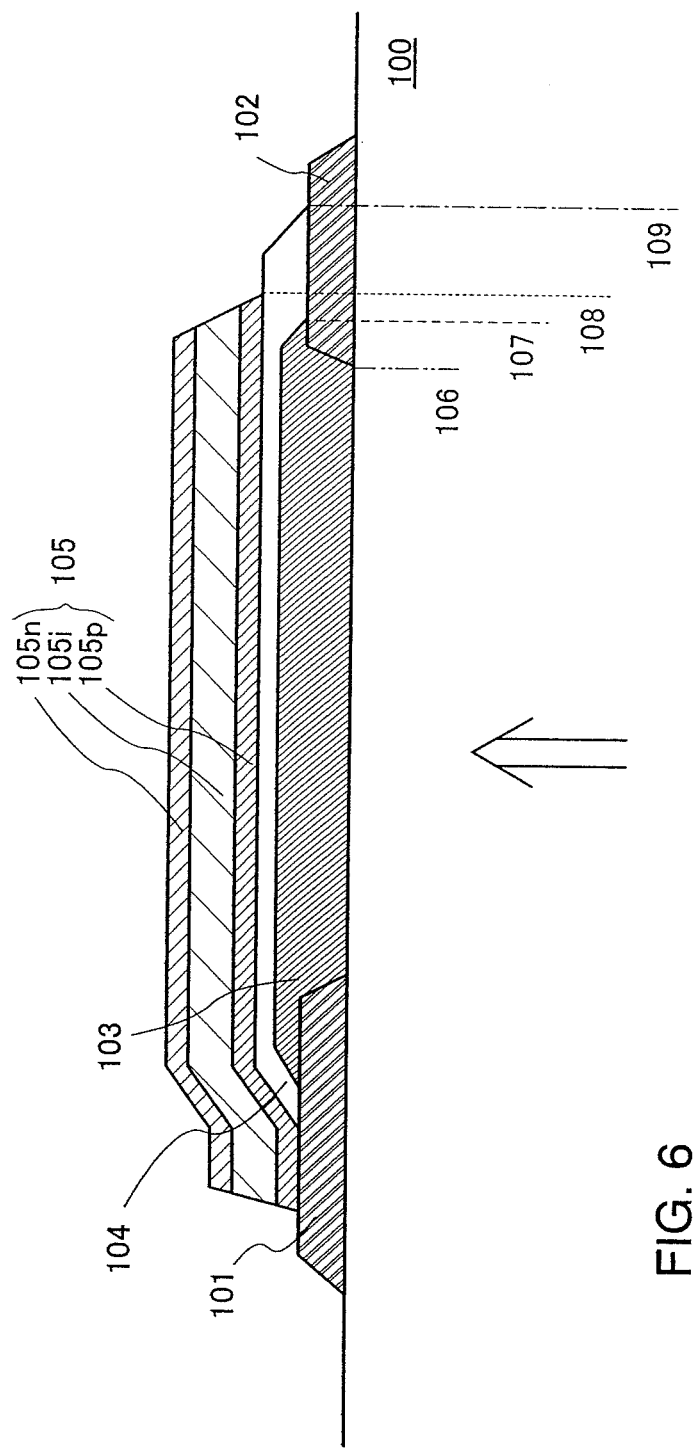
FIG. 6 is a cross-sectional view of a photoelectric conversion device of the present invention.

FIG. 6 shows a cross-sectional view of a photoelectric conversion device of the present invention. The photoelectric conversion device of the present invention has, over an insulating surface 100, electrodes 101 and 102, a color filter 103 formed between the electrodes 101 and 102, an overcoat layer 104 which is formed so as to cover the color filter 103, and a photoelectric conversion layer 105, which is formed over the overcoat layer 104 and electrically connected to part of the electrode 101 by the two being in contact with each other.

The insulating surface 100 may be a substrate surface or a surface of an insulating film provided over a substrate as will be subsequently described. In using a substrate, a light-transmitting glass substrate or flexible substrate may be used. When an insulating film provided over a substrate is used, the substrate and the insulating film preferably have light-transmitting properties. As examples of such an insulating film, a silicon oxide film, a silicon nitride film, a silicon oxide film containing nitrogen, and a silicon nitride film containing oxygen are given.

Note that, when light to the photoelectric conversion layer 105 enters from the insulating surface 100 side, a material of the insulating surface 100, for example, a substrate or an insulating film, preferably has high transmittance. In addition, when the material of the insulating surface 100 has selectivity for a light transmitting wavelength with respect to a wavelength in the range of visible light, a light sensor can have sensitivity in a specific wavelength range.

In addition, titanium (Ti) is used for the electrodes 101 and 102. The electrodes 101 and 102 may have conductivity and be formed of a single-layer film or stacked-layer film. However, since the electrodes 101 and 102 also serve as a light-shielding film of the photoelectric conversion layer 105, it is necessary to use a light-shielding material.

The overcoat layer 104 covering the color filter 103 may be formed using, a light-transmitting insulating material. For example, an organic resin material such as acrylic or polyimide or an inorganic material such as silicon nitride, silicon oxide, silicon oxide containing nitrogen, or silicon nitride containing oxygen can be used. In addition, it is also possible to form the overcoat layer 104 with the use of a stacked film of these materials. Moreover, the electrode 102 is not in contact with the photoelectric conversion layer 105 due to the color filter 103 and the overcoat layer 104 including the insulating material.

The photoelectric conversion layer 105 has a first semiconductor layer of one conductivity type, a second semiconductor layer, and a third semiconductor layer of an opposite conductivity type from that of the first semiconductor layer. For example, in this embodiment mode, a p-type semiconductor layer 105$p$, an i type semiconductor layer (also referred to as an intrinsic semiconductor layer) 105$i$, and an n-type semiconductor layer 105n are used for the photoelectric conversion layer 105. In this embodiment mode, a silicon layer is used for the semiconductor layer. The semiconductor layer may also be amorphous or semi-amorphous. Note that, in this specification, the i-type semiconductor layer refers to a semiconductor layer that contains impurities imparting p-type conductivity or n-type conductivity at a concentration of $1 \times 10^{20}$ cm$^{-3}$ or less and oxygen and nitrogen at a concentration of $5 \times 10^{19}$ cm$^{-3}$ or less, where photoconductivity with respect to dark conductivity is 100 times or more. In addition, the i-type semiconductor layer may be added with 10 to 1000 ppm of boron (B).

Note that a semi-amorphous semiconductor layer includes a semiconductor which has a structure intermediate between that of an amorphous semiconductor and a semiconductor having a crystalline structure (including single crystal and polycrystal structures). The semi-amorphous semiconductor layer has a third state which is stable in terms of free energy and is a crystalline substance having short-range order and lattice distortion. The crystal grain of which the size is 0.5 to 20 nm can exist by being dispersed in a non-single crystal semiconductor layer. The peak of the Raman spectrum of a semi-amorphous semiconductor layer is shifted to be lower than the wavenumber of 520 cm$^{-1}$, and the diffraction peaks of (111) and (220) that are thought to be caused by an Si crystal lattice are observed by X-ray diffraction. In addition, the semi-amorphous semiconductor layer contains hydrogen or a halogen of at least 1 atom % or more to terminate a dangling bond. In this specification, such a semiconductor layer is referred to as a semi-amorphous semiconductor (SAS) layer for the sake of convenience. Moreover, a noble gas element such as helium, argon, krypton, or neon is contained therein to further promote lattice distortion so that stability is enhanced and a favorable semi-amorphous semiconductor layer is obtained. Note that a microcrystalline semiconductor layer (microcrystal semiconductor layer) is also included in the semi-amorphous semiconductor layer.

In addition, the SAS layer can be obtained by glow discharge decomposition of gas containing silicon. For a typical gas containing silicon, $SiH_4$ is given, and, in addition, $Si_2H_6$, $SiH_2Cl_2$, $SiHCl_3$, $SiCl_4$, $SiF_4$, or the like can be used. The gas containing silicon is diluted with hydrogen or with a gas in which one or more of the noble gas elements of helium, argon, krypton, and neon are added to hydrogen; therefore, the SAS film can be easily formed. It is preferable that the gas containing silicon be diluted at a dilution ratio set to be in the range of 2 to 1000 times. Further, a carbide gas such as $CH_4$ or $C_2H_6$, a germanium gas such as $GeH_4$ or $GeF_4$, $F_2$, or the like may be mixed into the gas containing silicon so as to adjust the energy bandwidth to be from 1.5 to 2.4 eV or 0.9 to 1.1 eV.

As shown in FIG. 6, in a photoelectric conversion device of the present invention, the position of an end portion 106 of the electrode 102 lies inside an end portion 107 of the color filter 103. The position of the end portion 107 of the color filter 103 lies inside an end portion 108 of the photoelectric conversion layer 105. In addition, the position of the end portion 107 of the color filter 103 lies inside an end portion 109 of the overcoat layer 104. Further, it is desirable that the position of the end portion 108 of the photoelectric conversion layer 105 lie inside the end portion 109 of the overcoat layer 104.

Figure 7:
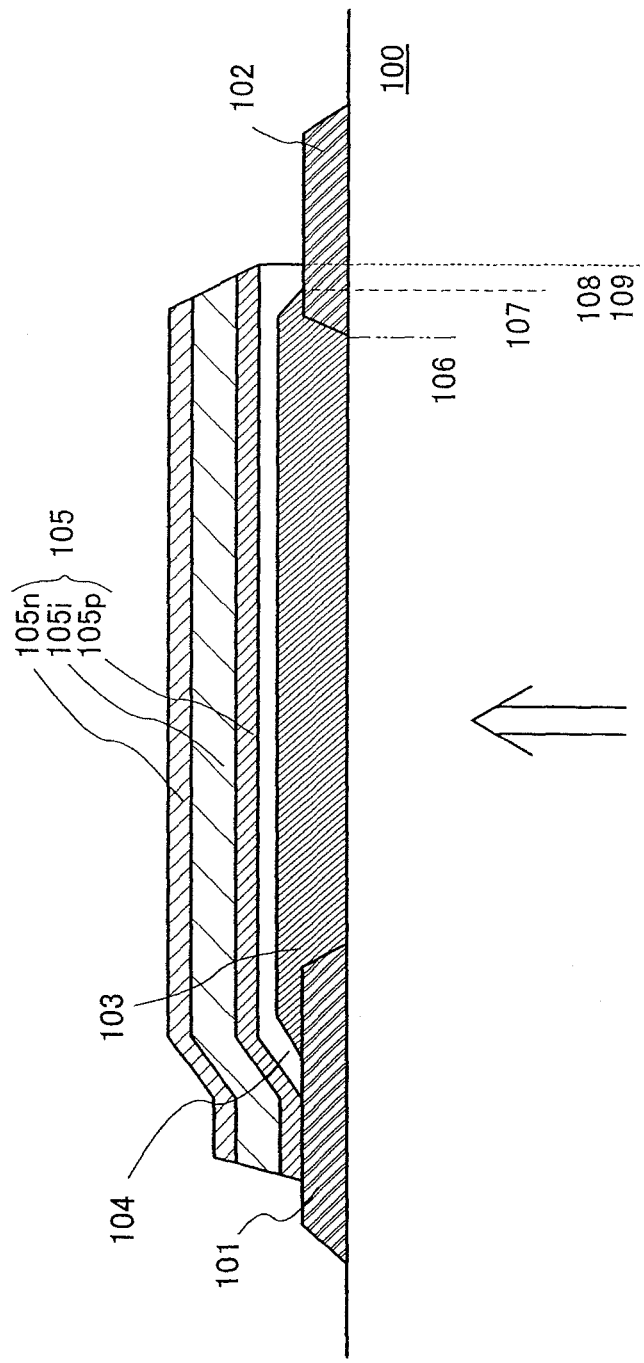
FIG. 7 is a cross-sectional view of a photoelectric conversion device of the present invention.

It is assumed that the overcoat layer 104 has been removed more than necessary by over etching when an etching step is performed for forming the photoelectric conversion layer 105 (see FIG. 7). Consequently, the end portion 109 does not move so as to fall inside the end portion 108 of the photoelectric conversion layer 105, even if the end portion 109 has been further moved inside. Therefore, since the position of the end portion 107 of the color filter 103 still lies inside the end portion 109 of the overcoat layer 104 which is over etched, the color filter 103 can keep a state of being covered with the overcoat layer.

Here, a photoelectric conversion device having a structure without the electrode 102 (see FIGS. 8A and 8B and FIGS. 9A and 9B) and the photoelectric conversion device of this embodiment mode (FIG. 6) will be compared.

Figure 8A:
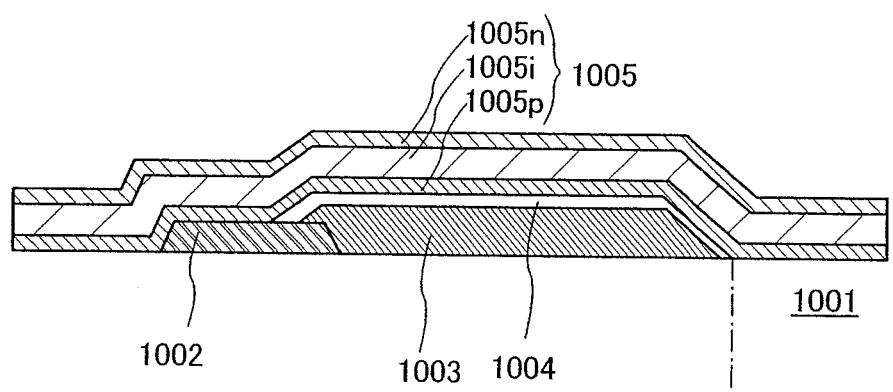
FIGS. 8A and 8B are comparative views each showing a photoelectric conversion device of the present invention.

FIG. 8A shows a structure of the photoelectric conversion device in the middle of a manufacturing process. In FIG. 8A, over an insulating surface 1001, an electrode 1002, a color filter 1003 formed to overlap with part of the electrode 1002, and an overcoat layer 1004 which is formed so as to cover the color filter 1003 are formed. Then, a semiconductor layer 1005 formed of a p-type semiconductor layer 1005p, an i-type semiconductor layer 1005i, and an n-type semiconductor layer 1005n is formed over the electrode 1002 and the overcoat layer 1004.

Figure 8B:
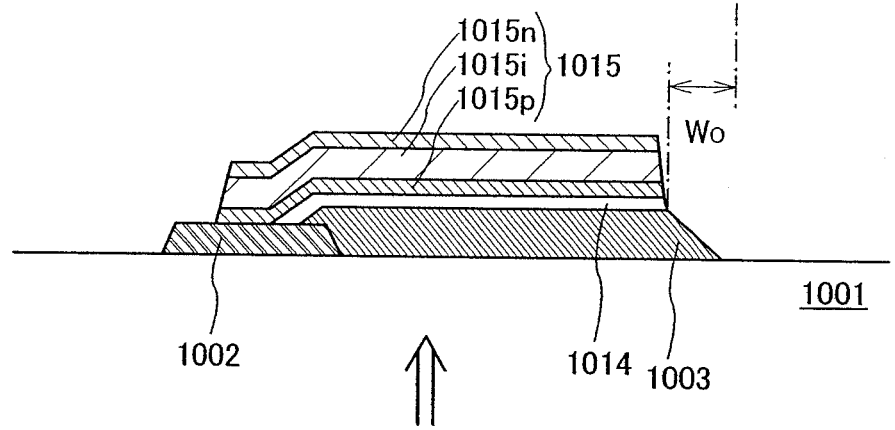

The semiconductor layer 1005 is etched to form a photoelectric conversion layer 1015 having a p-type semiconductor layer 1015p, an i-type semiconductor layer 1015i, and an n-type semiconductor layer 1015n. When the overcoat layer 1004 is over etched at this time, as shown in FIG. 8B, part of the surface of the color filter 1003 is exposed. In addition, the position of an end portion of an overcoat layer 1014 moves inside by a width Wo.

As described above, the color filter contains a substance that causes metallic contamination. Therefore, there is a concern that the exposure of the surface of the color filter 1003 will cause adverse effects on characteristics of the photoelectric conversion device.

Figure 9A:
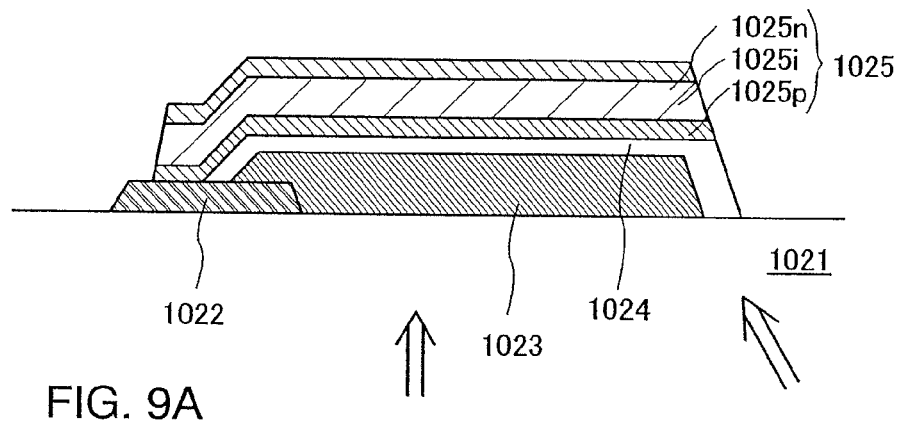
FIGS. 9A and 9B are comparative views each showing a photoelectric conversion device of the present invention.
Figure 9B:
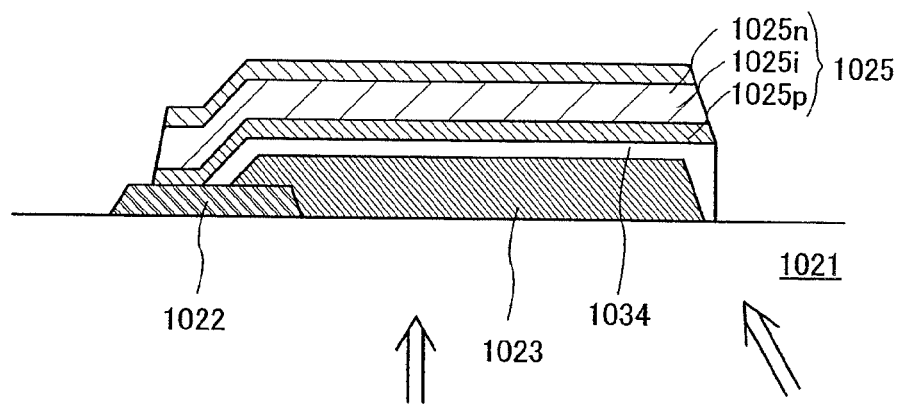

In order to avoid this, an example of forming a color filter inside a region where an overcoat layer and a photoelectric conversion layer are formed will be shown with reference to FIGS. 9A and 9B.

In FIG. 9A, over an insulating surface 1021, an electrode 1022, a color filter 1023, an overcoat layer 1024 covering the color filter 1023, and a photoelectric conversion layer 1025 electrically connected to part of the electrode 1022 by the two being in contact with each other are formed. The photoelectric conversion layer 1025 has a p-type semiconductor layer 1025p, an i-type semiconductor layer 1025i, and an n-type semiconductor layer 1025n.

FIG. 9B shows a structure where the overcoat layer 1024 of the photoelectric conversion device shown in FIG. 9A is over etched. Since the position of an end portion of the color filter 1023 lies inside an end portion of the photoelectric conversion layer 1025, the color Filter 1023 can keep a state of being covered with an overcoat layer 1034.

However, in the structures of FIGS. 9A and 9B, there is a concern that light will enter the photoelectric conversion layer 1025 from end portions of the overcoat layers 1024 and 1034 without passing through the color filter 1023. Therefore, there is a concern that the light that does not pass through the color filter 1023 will be detected by the photoelectric conversion layer 1025 so that a spectral sensitivity characteristic of the photoelectric conversion device deteriorates.

On the other hand, in the photoelectric conversion device shown in FIG. 6, since the electrode 102 is formed at the end portion of the overcoat layer 104, light from external is shielded and the electrode 102 also serves as a light-shielding film. In other words, light that does not pass through the color filter 103 does not enter the photoelectric conversion layer 105 from the end portion of the overcoat layer 104.

Through the above description, it is found that, in the photoelectric conversion device shown in FIG. 6, exposure of the color filter can be prevented and light that does not pass through the color filter can be prevented from entering the photoelectric conversion layer from the end portion of the overcoat layer by a shielding-film being provided, even when the overcoat layer is over etched.

Next, a manufacturing method of a semiconductor device having the photoelectric conversion device of the present invention will be explained with reference to FIG. 1, FIGS. 2A and 2B, FIGS. 3A and 3B, FIGS. 4A and 4B, FIG. 5A and FIG. 5B, FIG. 12, and FIGS. 18A to 18D.

Figure 12:
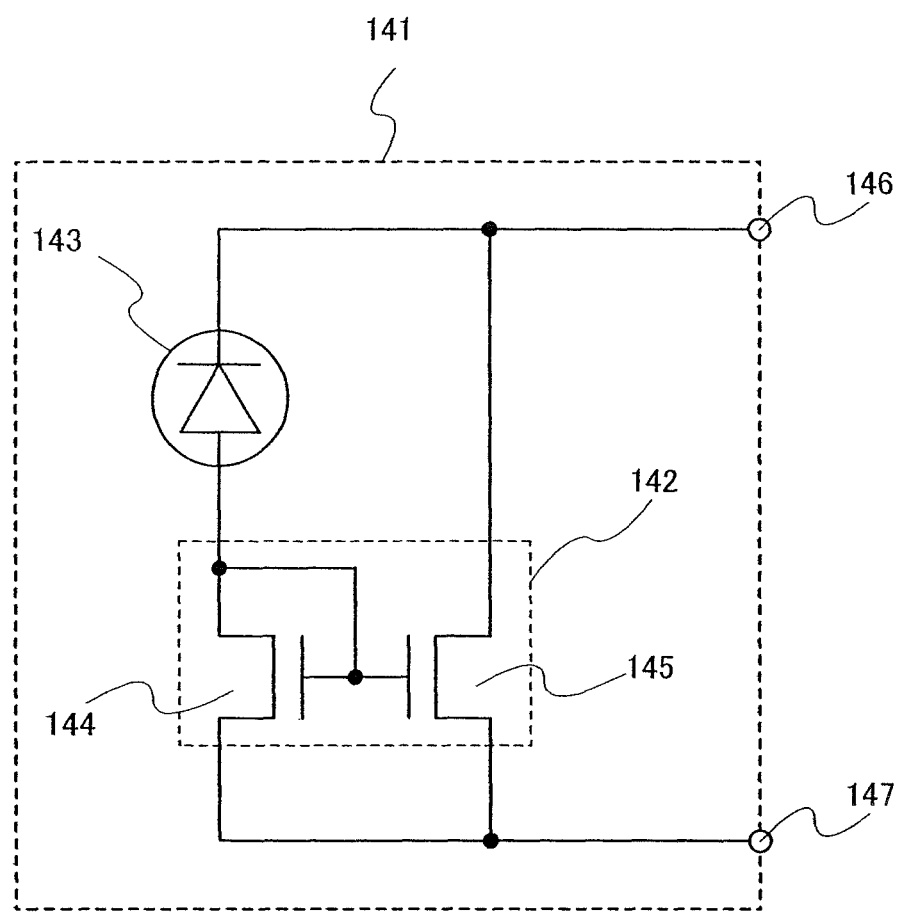
FIG. 12 is a semiconductor device circuit diagram having a photoelectric conversion device of the present invention.

In a semiconductor device shown in this embodiment mode, an amplifier circuit formed of thin film transistors and a photoelectric conversion device are integrated over the same substrate. FIG. 12 shows an example of a circuit diagram of the structure.

A semiconductor device 141 is provided with an amplifier circuit 142 that amplifies an output of a photoelectric conversion device 143. Various circuits can be applied as the amplifier circuit 142; however, in this embodiment mode, a current mirror circuit, which is the amplifier circuit 142, is formed of thin film transistors 144 and 145. Source or drain terminals of the thin film transistors 144 and 145 are connected to an external power supply terminal 147 and kept at a constant voltage, for example, kept at a ground voltage. The drain terminal of the thin film transistor 145 is connected to an output terminal 146. The photoelectric conversion device 143 is as described below. When a photodiode is used for the photoelectric conversion device 143, an anode thereof (a p-layer side) is connected to the drain terminal of the thin film transistor 144, and a cathode (an n-layer side) is connected to the output terminal 146.

When the photoelectric conversion device 143 is irradiated with light, a photoelectric current flows through the anode (the p-layer side) from the cathode (the n-layer side). Accordingly, the current flows through the thin film transistor 144 of the amplifier circuit 142, and a voltage that is necessary for flow of the current is generated in a gate. When a gate length L and a channel width W of the thin film transistor 145 are equal to those of the thin film transistor 144, gate voltages of the thin film transistors 144 and 145 are equal to each other in a saturation region; therefore, the same amount of current flows. When amplification of output current is desired, the n-number of the thin film transistors 145 may be connected in parallel. In this case, a current that is amplified in proportion to the number (n-number) of the transistors connected in parallel can be obtained.

Note that FIG. 12 shows a case where an n-channel thin film transistor is used; however, a photoelectric conversion device with the same function can be formed even when a p-channel thin film transistor is used.

Hereinafter, a manufacturing process of a semiconductor device of this embodiment mode will be described.

First, a base film 202 is formed over a substrate 201, and further thin film transistors (TFTs) 211 and 212 are formed. The substrate 201 can be formed with any materials as long as they have light-transmitting properties, and, for example, a light-transmitting glass substrate or flexible substrate is used. The thin film transistor 211 includes an active layer having a source region, a drain region, and a channel forming region, a gate insulating film, and a source or drain electrode 221. In the same manner, the thin film transistor 212 includes an active layer having a source region, a drain region, and a channel forming region, a gate insulating film, and a source or drain electrode 222.

Note that each of the active layers of the thin film transistors 211 and 212 may be provided with a low-concentration drain (Lightly Doped Drain (LDD)) region. The LDD region is a region to which an impurity element is added at low concentration between a channel forming region and a source or drain region which is formed by being doped with an impurity element at high concentration. By the LDD region being provided, the effects of reducing the electric field in the vicinity of the drain region and preventing deterioration due to hot carrier injection can be obtained. In addition, in order to prevent deterioration of the amount of on current due to hot carriers, the thin film transistor 211 may have a structure in which an LDD region and a gate electrode are disposed so as to overlap with each other with a gate insulating film interposed therebetween (in this specification, referred to as a "GOLD (Gate-drain Overlapped LDD) structure").

In addition, a sidewall for forming an LDD region may be formed on the side surface of a gate electrode.

An interlayer insulating film 203 is formed to cover each active layer, gate insulating film, and gate electrode of the thin film transistors 211 and 212. The interlayer insulating film 203 is preferably formed of a silicon nitride film in order to obtain hydrogenation effect of the active layers of the thin film transistors 211 and 212 and to prevent metal contamination from a color filter with the use of the interlayer insulating film as a passivation film. In addition, an interlayer insulating film 204 formed over the interlayer insulating film 203 is formed using an inorganic material such as silicon nitride, silicon oxide, silicon oxide containing nitrogen, or silicon nitride containing oxygen.

The source or drain electrode 221 of the thin film transistor 211 and the source or drain electrode 222 of the thin film transistor 212 are formed over the interlayer insulating film 204, and the electrodes are electrically connected to the respective active layers of the thin film transistors.

In addition, electrodes 115, 101, 102, 121, 122, and 116 are also formed over the interlayer insulating film 204 in a manufacturing process similar to that of the source or drain electrodes 221 and 222.

In this embodiment mode, the source or drain electrodes 221 and 222, the electrodes 101, 102, 121, 122, 115, and 116 are formed through the following process.

First, a conductive film, titanium (Ti) in this embodiment mode, is formed over the interlayer insulating film 204 in 400 nm thick with the use of a sputtering method. A conductive film for forming the electrodes 101, 102, 121, and 122 is formed with any materials as long as they are conductive materials; however, it is desirable to use a conductive metal film that is unlikely to become an alloy by reaction with a photoelectric conversion layer (typically, amorphous silicon) which will be subsequently formed. Molybdenum (Mo), tungsten (W), or the like may be used other than titanium (Ti).

Next, the conductive film is etched to form the source or drain electrodes 221 and 222, the electrodes 101, 102, 121, 122, 115, and 116; however, as for the electrodes 101, 102, 121, and 122, the conductive film is particularly etched so that each end portion becomes a tapered shape.

At this time, the electrodes 101, 102, 121, and 122 are formed so that each tapered angle has less than or equal to 80 degrees, preferably, less than or equal to 45 degrees. Accordingly, the photoelectric conversion layer, which will be subsequently formed, has favorable coverage and improved reliability (see FIG. 2A). In addition, as for a portion in contact with the photoelectric conversion layer which will be subsequently formed, the plane shapes of the electrodes 101, 102, 121, and 122 each have an angle of a vertex which is larger than 90 degrees, and desirably, the electrodes are formed so as to have a shape without angle.

Then, a color filter 103 is formed between the electrodes 101 and 102 over the interlayer insulating film 204 (see FIG. 2B).

Figure 3A:
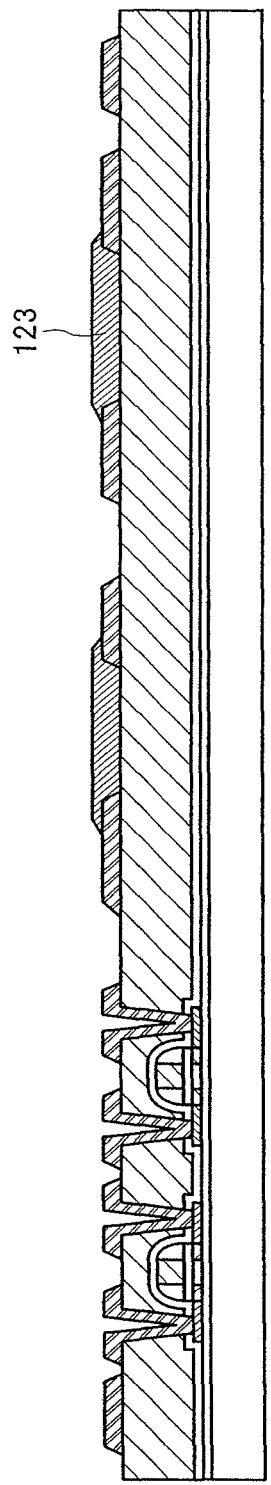
FIGS. 3A and 3B are views each showing a manufacturing process of a semiconductor device having a photoelectric conversion device of the present invention.

Further, a color filter 123 is formed between the electrodes 121 and 122 over the interlayer insulating film 204 (see FIG. 3A).

Note that, in order to detect visible light by colors being separated, a red color filter 123R corresponding to red light, a green color filter 123G corresponding to green light, and a blue color filter 123B corresponding to blue light are formed in the color filter 123. However, when a photoelectric conversion device where monochromatic light is read is manufactured, the color filter 123 may have a monochromatic color filter.

The color filters are manufactured by coating, light-exposure, developing, and baking of a raw material.

Figure 3B:
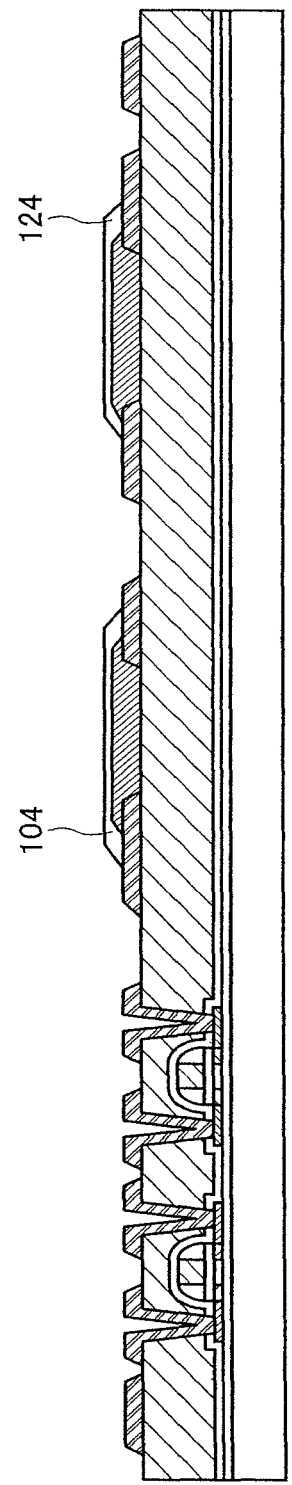

Next, an overcoat layer 104 covering the color filter 103 and an overcoat layer 124 covering the color filter 123 are formed (see FIG. 3B).

Each of the overcoat layer 104 covering the color filter 103 and the overcoat layer 124 covering the color filter 123 may be formed using a light-transmitting insulating material. For example, it is possible to use an organic resin material such as acrylic or polyimide or an inorganic material such as silicon nitride, silicon oxide, silicon oxide containing nitrogen, or silicon nitride including oxygen. In addition, it is also possible to use a stacked film of these materials.

The positions of end portions of the overcoat layer 104 each lie inside end portions of the electrodes 101 and 102, and light from the substrate 201 side does not enter the end portions of the overcoat layer 104. In addition, similar to the overcoat layer 104, light to end portions of the overcoat layer 124 is shielded due to the electrodes 121 and 122.

Figure 19:
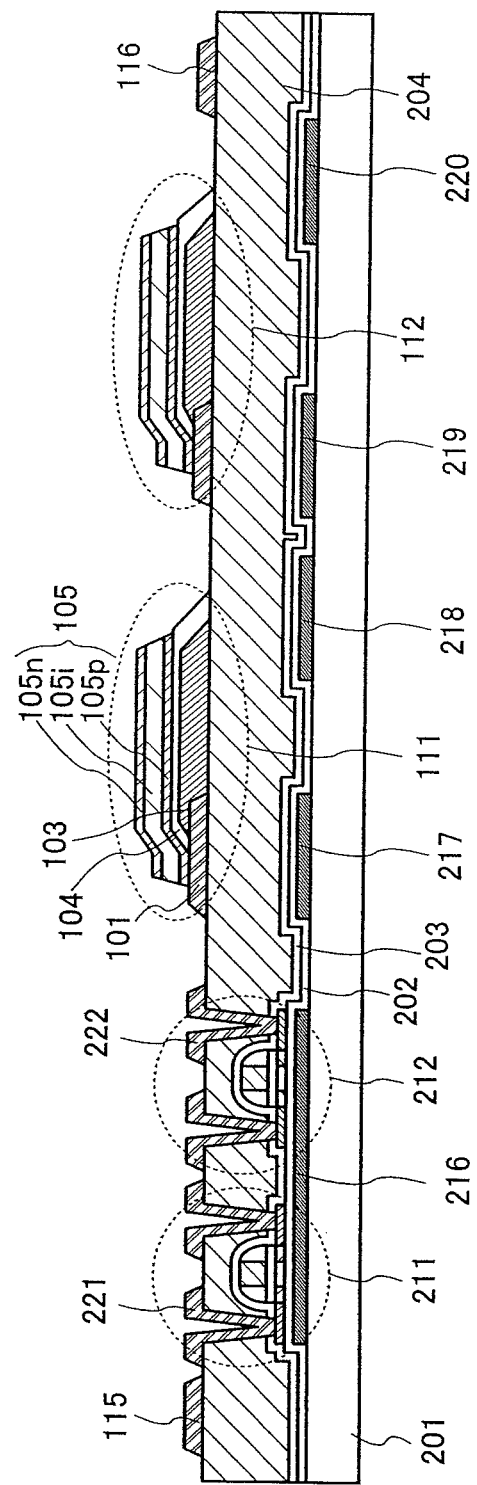
FIG. 19 is a cross-sectional view of a semiconductor device having a photoelectric conversion device of the present invention.

In this embodiment mode, the light is shielded due to the electrodes 121 and 122; however, the light may also be shielded due to the gate electrodes of the thin film transistors. In addition, as shown in FIG. 19, a light-shielding layer 216 between thin film transistors and a substrate and light-shielding layers 217 to 220 between the substrate and photoelectric conversion devices 111 and 112 may be provided. However, it is possible to improve reliability of the thin film transistors being provided so as to be shielded from light at the same time as shielding of end portions of the photoelectric conversion layers from light. Note that the light-shielding layers 216 to 220 can be formed using a material similar to that of the electrodes 101 and 102.

Next, a photoelectric conversion layer is formed over the overcoat layers 104 and 124. A manufacturing process of a photoelectric conversion layer 105 over the overcoat layer 104 will be explained here for simplification of the explanation; however, the photoelectric conversion layer over the overcoat layer 124 is also formed in the same manner.

In addition, as described above, when the color filters 123R, 123G, and 123B are formed to correspond to each of R, and B in the color filter 123 in order to detect visible light by colors being separated, the photoelectric conversion layers are also formed so as to correspond to each color filter. In other words, as for three photoelectric conversion layers for RGB, color filters of RGB corresponding to each of them are formed, and the color filters can be counted as one unit.

A p-type semiconductor layer 105p is formed over the overcoat layer 104. In this embodiment mode, for example, a p-type amorphous semiconductor layer is formed as the p-type semiconductor layer 105p. As the p-type amorphous semiconductor layer, an amorphous silicon layer containing an impurity element belonging to Group 13 of a periodic table, for example, boron (B), is formed by a plasma CVD method.

After the p-type semiconductor layer 105p is formed, further a semiconductor layer (referred to as an intrinsic semiconductor layer or an i-type semiconductor layer) 105i where impurities imparting a conductivity type are not contained and an n-type semiconductor layer 105n are sequentially formed. In this embodiment mode, the p-type semiconductor layer 105p is formed in 10 to 50 nm thick, the i-type semiconductor layer 105i is formed in 200 to 1000 nm thick, and the n-type semiconductor layer 105n is formed in 20 to 200 nm thick (see FIG. 1). As described above, the photoelectric conversion layers 111 and 112 are manufactured.

As the i-type semiconductor layer 105I, for example, an amorphous silicon layer may be formed by a plasma CVD method. As the n-type semiconductor layer 105n, an amorphous silicon layer containing an impurity element belonging to Group 15, for example, phosphorus (P), may be formed or an impurity element belonging to Group 15 may be introduced after the amorphous silicon layer is formed.

Note that the p-type semiconductor layer 105p, the i-type semiconductor layer 105i, and the n-type semiconductor layer 105n may be stacked in a reverse order, in other words, the n-type semiconductor layer, the i-type semiconductor layer, and the p-type semiconductor layer may be sequentially stacked.

In addition, as the p-type semiconductor layer 105p, the i-type semiconductor layer 105i, and the n-type semiconductor layer 105n, not only the amorphous semiconductor layer but also a semi-amorphous semiconductor layer may be used.

The p-type semiconductor layer 105p, the i-type semiconductor layer 105i, and the n-type semiconductor layer 105n, in particular, one end portion of the lowest p-type semiconductor layer 105p is electrically connected to the electrode 101. On the other hand, the other end portion of the p-type semiconductor layer 105p is over the overcoat layer 104 and insulated from the electrode 102. Since the light that is shielded due to the electrode 102 passes through the color filter 123, the second electrode 102 also serves as a light-shielding film which suppresses light that reaches the photoelectric conversion layer 105.

Note that the cross-sectional views of the photoelectric conversion device of this embodiment mode are explained in FIG. 2A and FIG. 2B, FIG. 3B, and FIG. 1; on the other hand, an example of top views corresponding to each of the cross-sectional views is shown in FIGS. 18A to 18D.

Figure 18A:
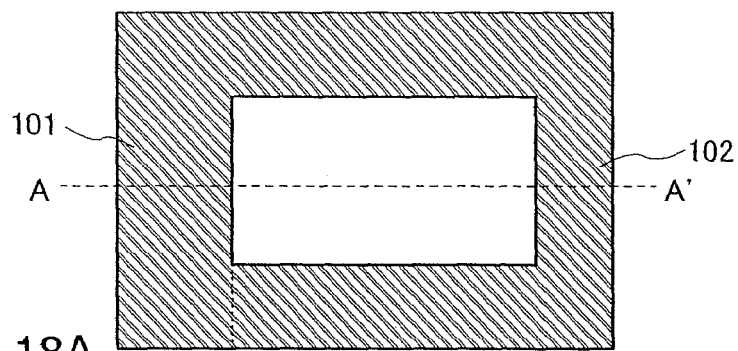
FIGS. 18A to 18D are top views each showing a manufacturing process of a photoelectric conversion device of the present invention.
Figure 18B:
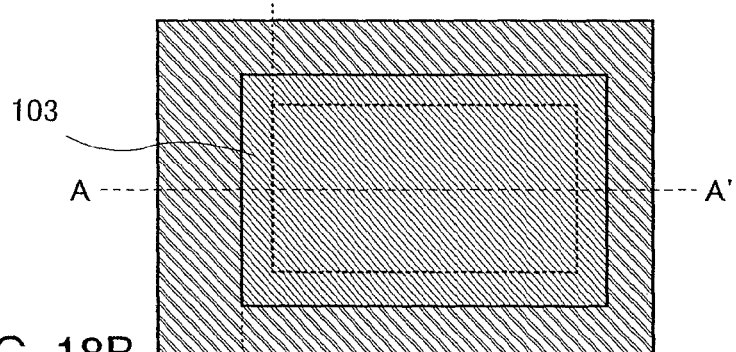
Figure 18C:
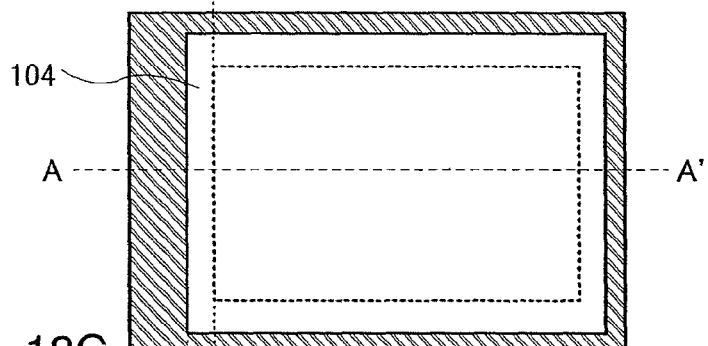

In FIGS. 18A to 18D, cross-sectional views taken along lines A-A' are shown in FIGS. 2A an 2B, FIG. 3B, and FIG. 1. In FIG. 2A, the electrodes 101 and 102, which serve as light-shielding layers, are shown as if being separated; however, the electrodes may be formed of a series of conductive layers as shown in FIG. 18A.

Figure 18D:
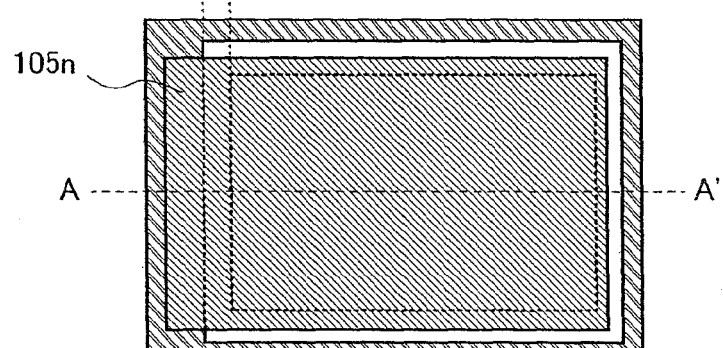

In addition, in FIG. 18D, only the uppermost n-type semiconductor layer 105n is shown in the photoelectric conversion layer 105; however, the i-type semiconductor layer 105i and the p-type semiconductor layer 105p are formed below the n-type semiconductor layer 105n.

Next, an insulating film 151 is formed to cover the entire surface by a screen printing method or an ink-jet method. In this embodiment mode, an epoxy resin is used for the insulating film 151; however, other photosensitive resins may also be used (see FIG. 4A).

Then, an electrode 153 electrically connected to the electrode 115 is formed over the insulating film 151. In the same manner, over the insulating film 151, an electrode 155 is formed to be in contact with the uppermost photoelectric conversion layer 105 (here, the n-type semiconductor layer 105n) of the photoelectric conversion device 111, in contact with the uppermost photoelectric conversion layer of the photoelectric conversion device 112, and electrically connected to the electrode 116 (see FIG. 4B).

The electrodes 153 and 155 are formed of titanium (Ti) by sputtering or photolithography. In addition, the electrodes 153 and 155 may also be formed by a screen printing method. when a screen printing method is employed, the electrodes 153 and 155 each have a single-layer structure of titanium (Ti) or a stacked structure of nickel (Ni) and copper (Cu) for improvement in wettability to solder which will be provided in the subsequent step and improvement in intensity in mounting.

Next, an insulating film 161 is formed by a screen printing method or the like over the insulating film 151, the electrodes 153 and 155 as a sealing resin. The insulating film 161 may be formed of the material similar to that of the insulating film 151. However, the insulating film 161 is not formed over parts of the electrodes 153 and 155, and an exposed region is formed in each of the electrodes 153 and 155 (see FIG. 5A).

Then, an electrode 165 electrically connected to the electrode 153 and an electrode 166 electrically connected to the electrode 155 are formed over the insulating film 161. The electrodes 165 and 166 are solder electrodes, which have respective functions as external output electrodes.

As described above, the photoelectric conversion device of the present invention is explained with reference to FIG. 6 and FIG. 7, and further the advantage of the photoelectric conversion device of the present invention is explained with reference to FIGS. 8A and 8B and FIGS. 9A and 9B. Further, the manufacturing process of the semiconductor device having the photoelectric conversion device of the present invention is explained with reference to FIG. 1, FIGS. 2A and 2B, FIGS. 3A and 3B, FIGS. 4A and 4B, and FIGS. 5A and 5B.

Furthermore, in this embodiment mode, light is shielded due to the electrodes 102 and 122; however, the light may also be shielded due to the gate electrodes of the thin film transistors. In addition, as shown in FIG. 19, the light-shielding layer 216 may be provided between the thin film transistors and the substrate. However, it is possible to improve reliability of the thin film transistors being provided so as to be shielded from light at the same time as shielding of end portions of the photoelectric conversion layers from light. In addition, the light-shielding layers 217, 218, 219, and 220 that shield the end portions of the photoelectric conversion layers 111 and 112 from light may also be formed between the substrate and the photoelectric conversion layer 111 in the same layer as the light-shielding layer 216. Note that the light-shielding layers 216 to 220 can be formed using a material similar to that of the electrodes 101 and 102.

Note that this embodiment mode can be combined with other embodiment modes and an embodiment, if necessary.

[Embodiment Mode 2]

This embodiment mode will show an example of a semiconductor device having a structure different from that of Embodiment Mode 1. However, the same portions as those of Embodiment Mode 1 are denoted by the same reference numerals, and portions, which are not particularly explained, follow the description of Embodiment Mode 1.

Figure 10:
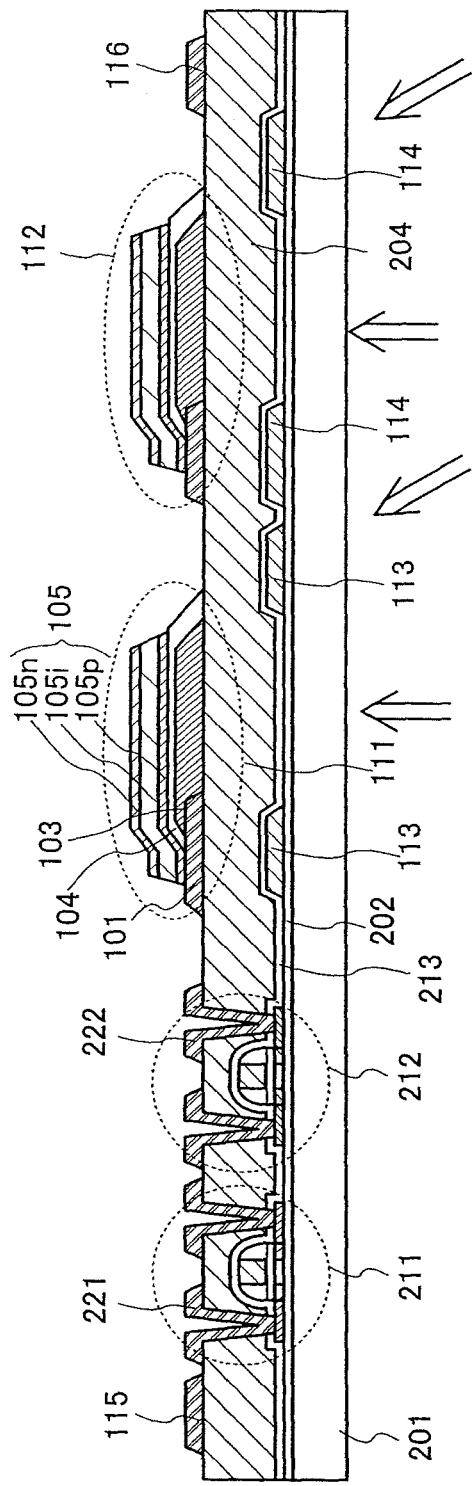
FIG. 10 is a cross-sectional view of a semiconductor device having a photoelectric conversion device of the present invention.

FIG. 10 shows a cross-sectional view of a semiconductor device having a photoelectric conversion device of this embodiment mode. FIG. 10 differs from FIG. 1 in that the electrodes 102 and 122 formed over the interlayer insulating film 204 in FIG. 1 are not formed. Instead of the electrodes 102 and 122, electrodes 113 and 114 each serving as a light-shielding film which are formed of a material and in steps similar to those of thin film transistors 211 and 222 are formed over a base film 202. The electrodes 113 and 114 serving as light-shielding films are covered with interlayer insulating films 213 and 204.

Light that is intended to enter a photoelectric conversion layer 105 from an end portion of an overcoat layer 104 without passing through a color filter 103 in a photoelectric conversion device 111 can be shielded due to the electrode 113 serving as a light-shielding film. In addition, the electrode 114 serving as a light-shielding film serves in the same manner for a photoelectric conversion device 112.

The photoelectric conversion device of this embodiment mode can also prevent stray light from entering the photoelectric conversion layer 105 from the end portion of the overcoat layer 104 without through the color filter 103.

In FIG. 10, only two color filters and photoelectric conversion devices are shown; however, it is necessary to provide three color filters and photoelectric conversion devices for RGB when visible light is detected by colors being separated. In addition, in FIG. 10, the color filters provided in the photoelectric conversion devices 111 and 112 are each a color filter of different color. However, in reading a monochromatic image, a color filter may be monochromatic.

Figure 20:
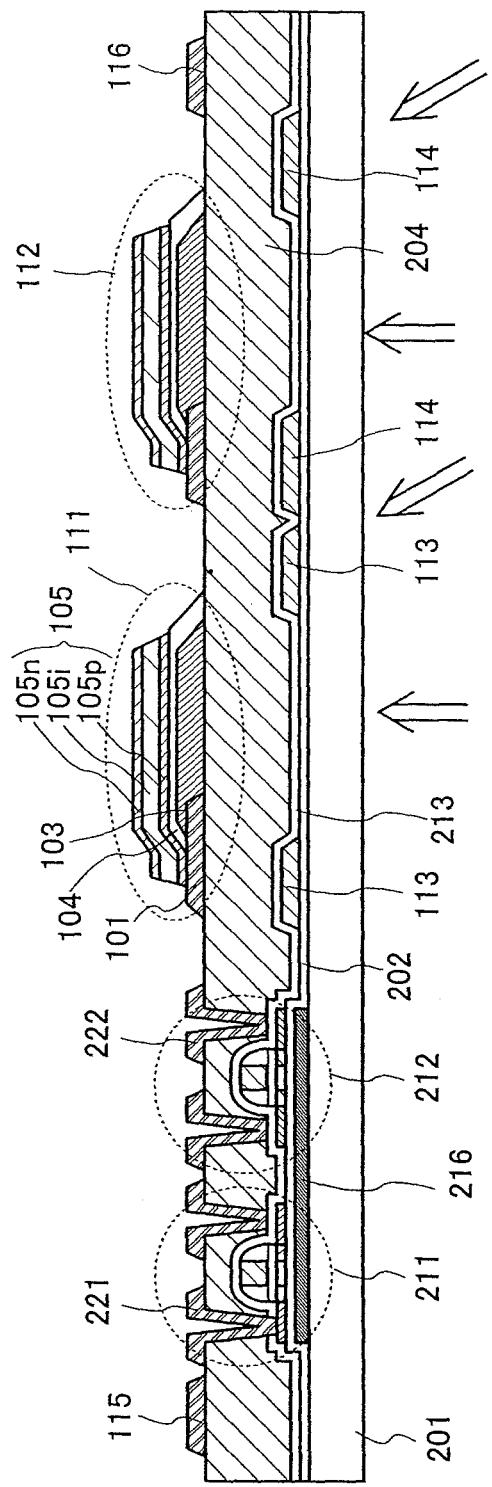
FIG. 20 is a cross-sectional view of a semiconductor device having a photoelectric conversion device of the present invention.

In this embodiment mode, the light is shielded due to the electrodes 113 and 114; however, the light may also be shielded due to gate electrodes of the thin film transistors. In addition, as shown in FIG. 20, a light-shielding layer 216 may be provided between the thin film transistors and the substrate. However, it is possible to improve reliability of the thin film transistors being provided so as to be shielded from light at the same time as shielding of end portions of photoelectric conversion layers from light. Note that the light-shielding layer 216 can be formed using a material similar to that of electrodes 101 and 102.

Note that this embodiment mode can be combined with other embodiment modes and an embodiment, if necessary.

[Embodiment Mode 3]

Figure 11:
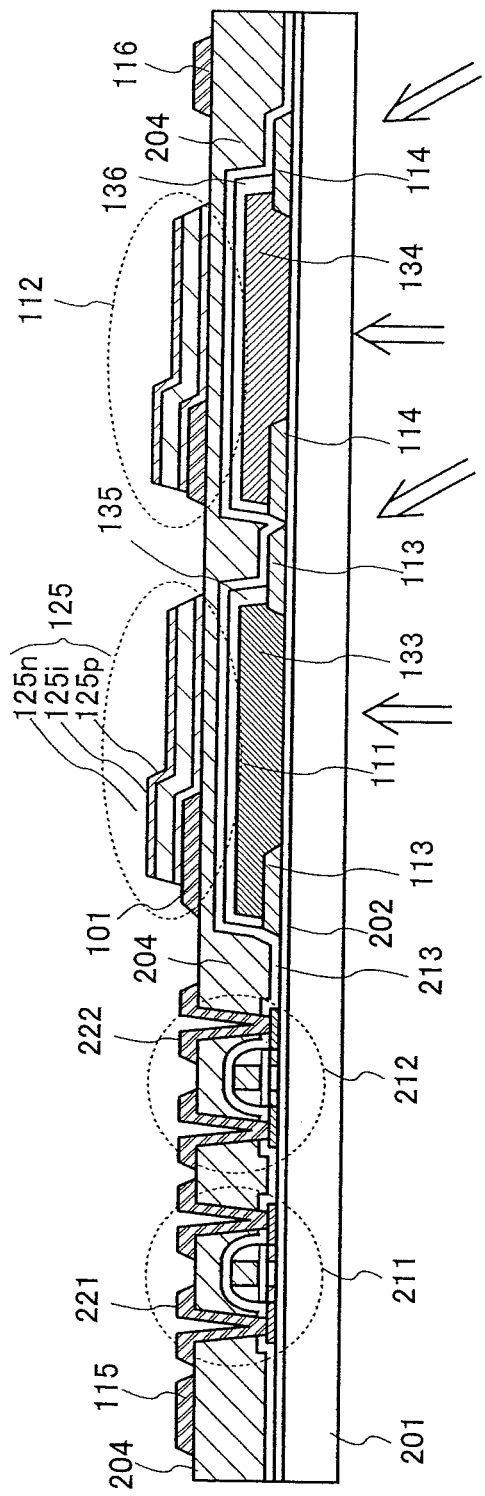
FIG. 11 is a cross-sectional view of a semiconductor device having a photoelectric conversion device of the present invention.
Figure 21:
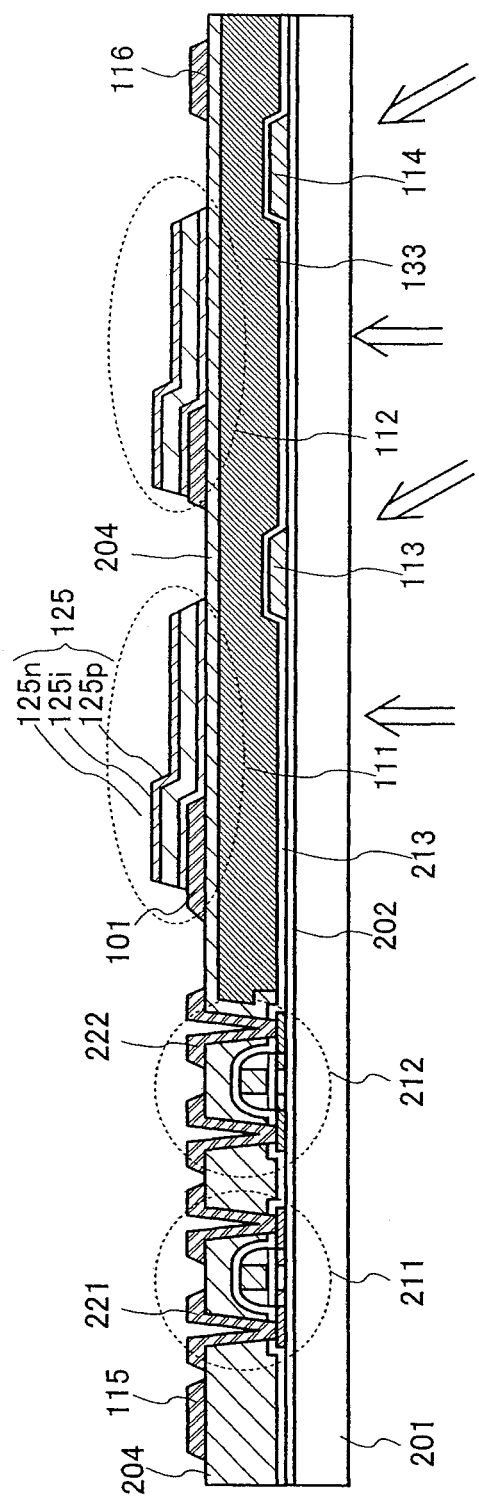
FIG. 21 is a cross-sectional view of a semiconductor device having a photoelectric conversion device of the present invention.

This embodiment mode will explain a structure shown in FIG. 10, where a color filter 133 is further provided between a base film 202 and an interlayer insulating film 204, with reference to FIG. 11 and FIG. 21.

FIG. 11 shows a semiconductor device for detecting visible light by colors being separated, where the color filter 133, an electrode 113 which is a light-shielding layer, and an overcoat layer 135 are formed over the base film 202. An interlayer insulating film 213 covering active layers, gate electrodes, and gate insulating films of thin film transistors 211 and 212 covers the overcoat layer 135 and the electrode 113. In a similar manner, the interlayer insulating film 213, which is provided below a photoelectric conversion device 112, covers a color filter 134, an electrode 114 also serving as a light-shielding film, and an overcoat layer 136 which are provided over the base film 202. The interlayer insulating film 204 is formed over the interlayer insulating film 213. A source or drain electrode 221 of the thin film transistor 211, which is formed over the interlayer insulating film 204, is connected to each active layer of the thin film transistors 211 and 212 through a contact hole formed in the interlayer insulating film 204.

In a photoelectric conversion device 111, one end portion of a photoelectric conversion layer 125 having a p-type semiconductor layer 125p, an i-type semiconductor layer 125i, and an n-type semiconductor layer 125n is in contact with and electrically connected to an electrode 101. On the other hand, the other end of the photoelectric conversion layer 125 can prevent stray light from entering the end portion of the photoelectric conversion layer 125 due to the electrode 113 which is formed of a material and in steps similar to those of the thin film transistors. Note that an electrode 114 also serves in the same manner for the photoelectric conversion device 112.

The photoelectric conversion devices 111 and 112 are separated from the color filter 133 by the interlayer insulating film 204. The interlayer insulating film 204 is formed using an inorganic material such as silicon nitride, silicon oxide, silicon oxide containing nitrogen, or silicon nitride containing oxygen as described above.

In FIG. 11, only two color filters and photoelectric conversion devices are shown; however, it is necessary to provide three color filters and photoelectric conversion devices for RGB when visible light is detected by colors being separated. In addition, in FIG. 11, the color filters 133 and 134 are each a color filter of different color. However, in reading monochromatic light, such a structure that is shown in FIG. 21 may also be employed. The color filter 133 in FIG. 11 is a monochromatic color filter.

[Embodiment 1]

This embodiment shows examples where the photoelectric conversion device of the present invention is applied to various electronic devices. As specific examples, computers, displays, cellular phones, televisions, and the like are given. Such electronic devices are explained with reference to FIG. 13, FIGS. 14A and 14B, FIGS. 15A and 15B, FIG. 16, and FIGS. 17A and 17B.

Figure 13:
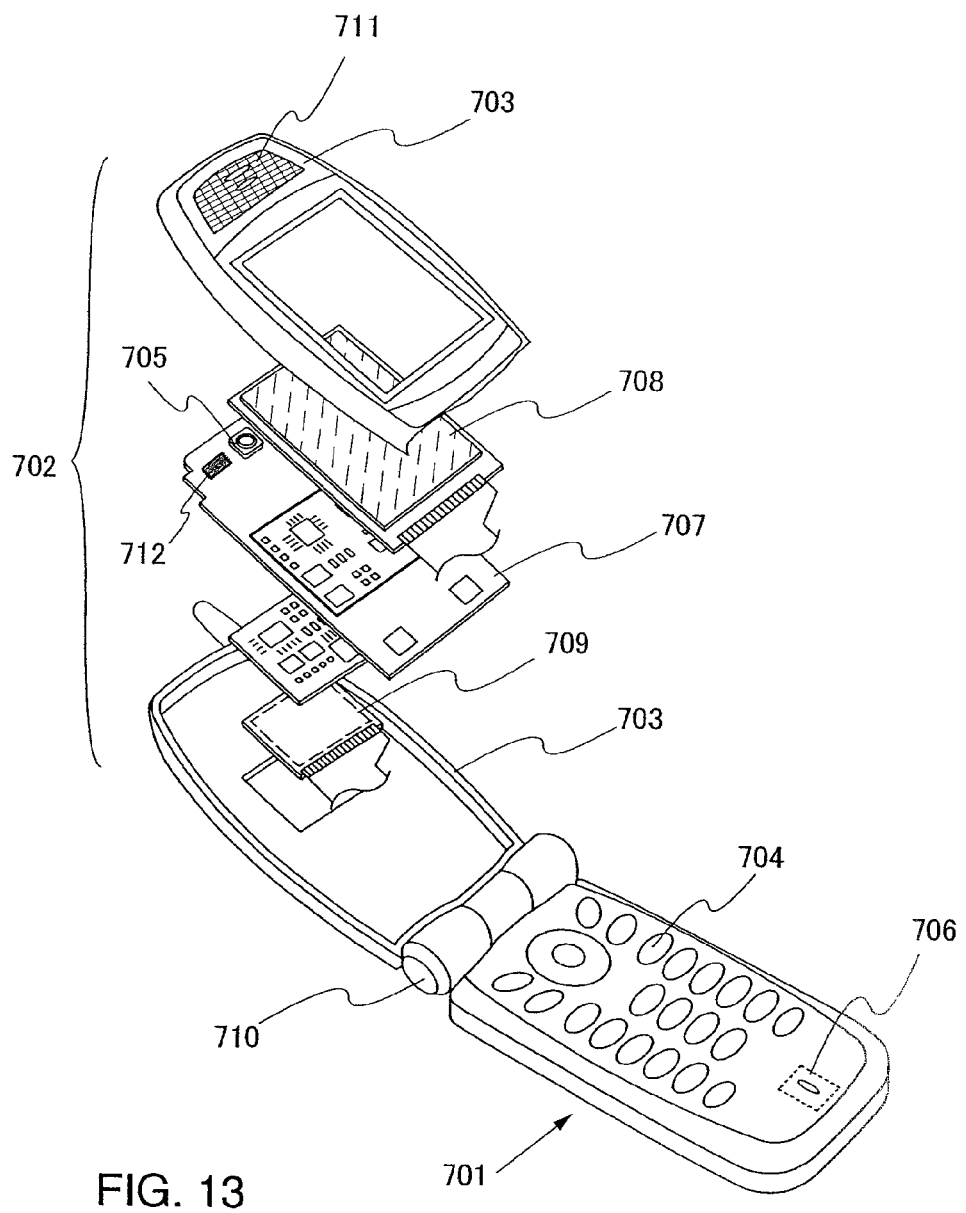
FIG. 13 is a view showing an example of an electronic device where a photoelectric conversion device of the present invention is incorporated.

FIG. 13 shows a cellular phone, which includes a main body (A) 701, a main body (B) 702, a chassis 703, operation keys 704, an audio output portion 705, an audio input portion 706, a circuit board 707, a display panel (A) 708, a display panel (B) 709, a hinge 710, and a light-transmitting material portion 711. A semiconductor device 712 including the photoelectric conversion device is provided inside the chassis 703.

The semiconductor device 712 detects light which has passed through the light-transmitting material portion 711, controls the luminance of the display panel (A) 708 and the display panel (B) 709 depending on the illuminance of the detected external light, and controls the illumination of the operation keys 704 based on the illuminance obtained by the semiconductor device 712. In such a manner, current consumption of the cellular phone can be reduced. By having the semiconductor device 712, the cellular phone has characteristics, which can be improved.

Figure 14A:
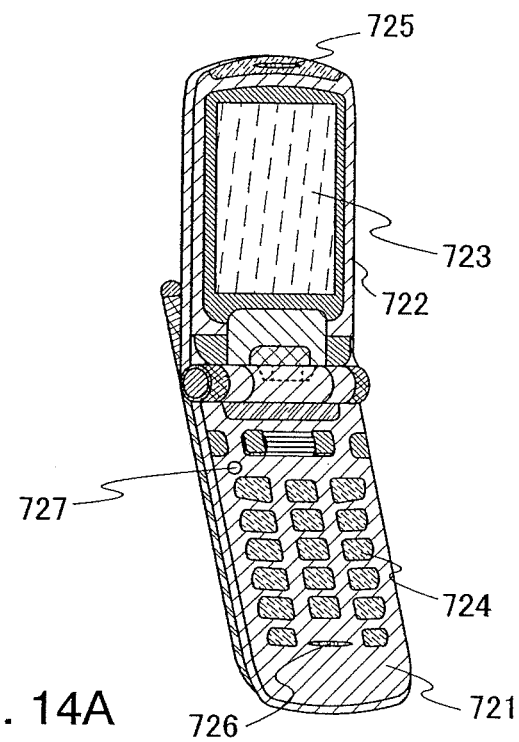
FIGS. 14A and 14B are views each showing an example of an electronic device where a photoelectric conversion device of the present invention is incorporated.
Figure 14B:
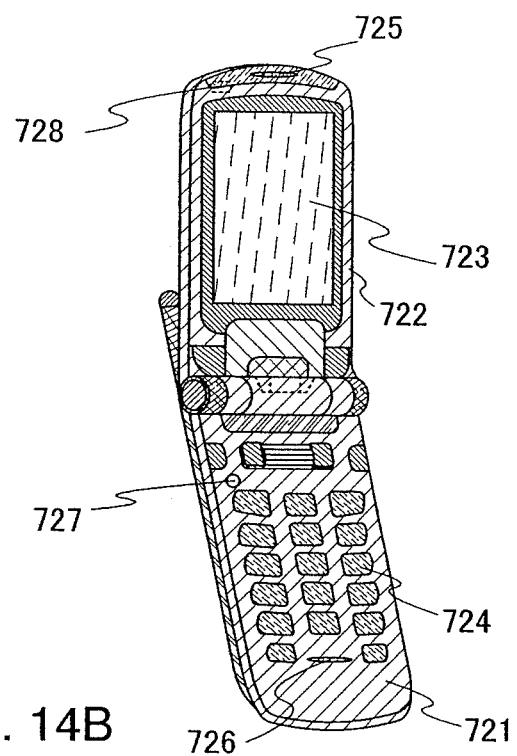

FIGS. 14A and 14B show other examples of a cellular phone. In FIGS. 14A and 14B, a main body 721 includes a chassis 722, a display panel 723, operation keys 724, an audio output portion 725, an audio input portion 726, and semiconductor devices 727 and 728 each including the photoelectric conversion device.

In the cellular phone shown in FIG. 14A, the luminance of the display panel 723 and the operation keys 724 can be controlled through the detection of external light by the semiconductor device 727 including the photoelectric conversion device provided in the main body 721.

In addition, in the cellular phone shown in FIG. 14B, the semiconductor device 728 including the photoelectric conversion device is provided inside the main body 721 in addition to the structure of FIG. 14A. By the semiconductor device 728 including the photoelectric conversion device, the luminance of a backlight that is provided in the display panel 723 can also be detected.

In FIG. 13 and FIGS. 14A and 14B, the photoelectric conversion device provided with a circuit that amplifies a photoelectric current to be extracted as voltage output is provided in the cellular phone. Therefore, the number of components mounted on the circuit board can be reduced, and the cellular phone itself can be downsized.

Figure 15A:
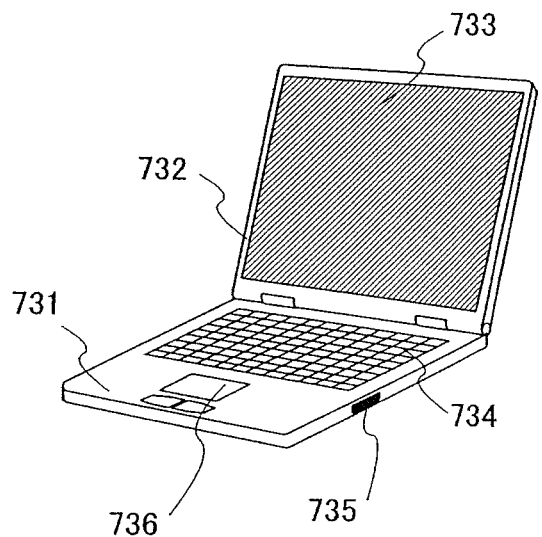
FIGS. 15A and 15B are views each showing an example of an electronic device where a photoelectric conversion device of the present invention is incorporated.

FIG. 15A shows a computer, which includes a main body 731, a chassis 732, a display portion 733, a keyboard 734, an external connection port 735, a pointing mouse 736, and the like.

Figure 15B:
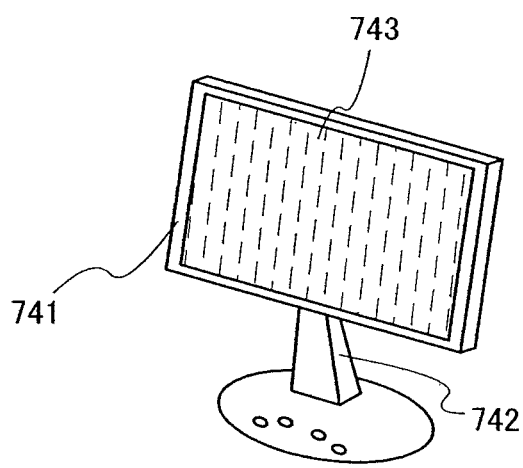

In addition, FIG. 15B shows a display device such as a television receiver. The display device includes a chassis 741, a support 742, a display portion 743, and the like.

Figure 16:
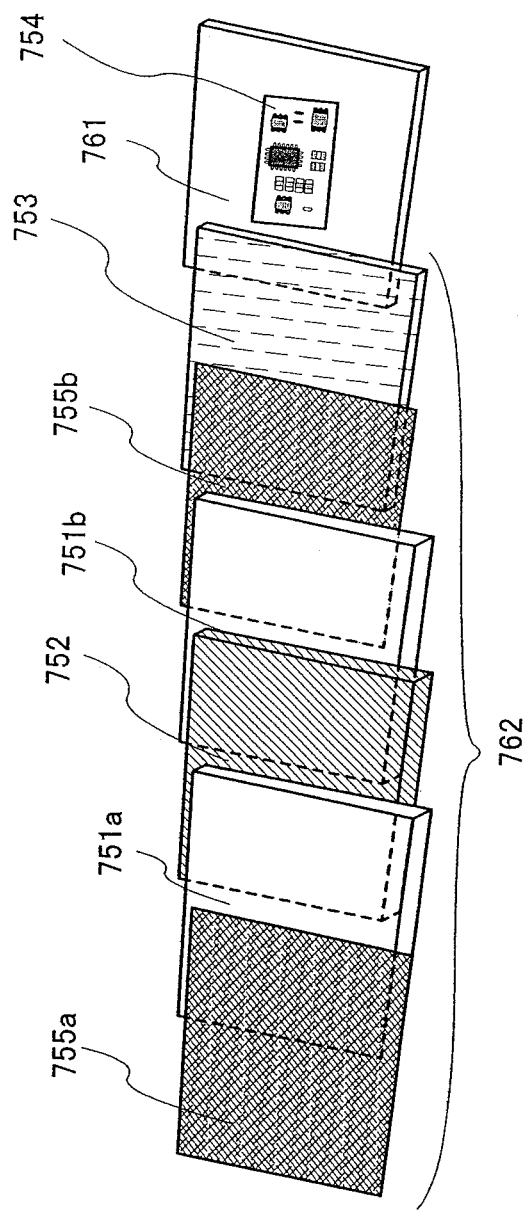
FIG. 16 is a view showing an example of an electronic device where a photoelectric conversion device of the present invention is incorporated.

FIG. 16 shows a detailed structure of cases where liquid crystal panels are used for the display portion 733 of the computer shown in FIG. 15A and the display portion 743 of the display device shown in FIG. 15B.

A liquid crystal panel 762 shown in FIG. 16 is incorporated in a chassis 761 and includes substrates 751a and 751b, a liquid crystal layer 752 interposed between the substrates 751a and 751b, polarizing filters 755a and 755b, a backlight 753, and the like. In addition, a semiconductor device 754 including the photoelectric conversion device is formed in the chassis 761.

The semiconductor device 754 including the photoelectric conversion device, which is manufactured using the present invention, detects each amount of RGB light from the LED backlight 753, and the information is fed back to adjust the luminance of the liquid crystal panel 762. Specifically, since temperature dependency of LED for each of RGB is different, each amount of RGB light from the LED backlight is detected so as to adjust white balance by compensation of variation in LED and compensation of deterioration in LED.

Figure 17A:
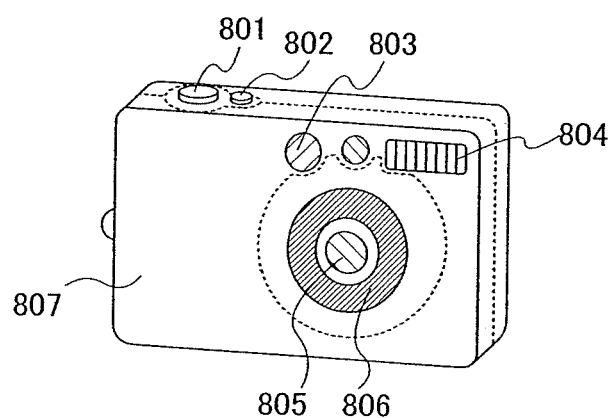
FIGS. 17A and 17B are views each showing an example of an electronic device where a photoelectric conversion device of the present invention is incorporated.
Figure 17B:
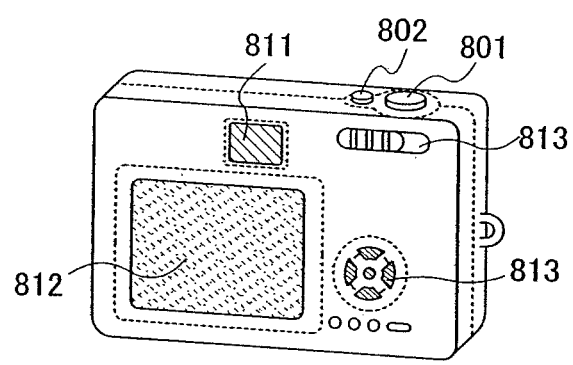

FIGS. 17A and 17B are views each showing an example in which the photoelectric conversion device of the present invention or a semiconductor device having the photoelectric conversion device is incorporated into a camera such as a digital camera. FIG. 17A is a perspective view seen from a front side direction of the digital camera. FIG. 17B is a perspective view seen from a backside direction. In FIG. 17A, the digital camera is provided with a release button 801, a main switch 802, a viewfinder 803, a flash portion 804, a lens 805, a barrel 806, and a chassis 807.

In FIG. 17B, an eyepiece finder 811, a monitor 812, and operation buttons 813 are provided. When the release button 801 is pushed down to the half point, a focus adjustment mechanism and an exposure adjustment mechanism are operated, and when the release button is pushed down to the lowest point, a shutter is opened. By the main switch 802 being pushed down or rotated, a power supply of the digital camera is switched on or off.

The viewfinder 803 is located above the lens 805, which is on the front side of the digital camera, for confirming a shooting range and the focus point from the eyepiece finder 811 shown in FIG. 17B. The flash portion 804 is located in the upper position on the front side of the digital camera. When the subject brightness is not enough, auxiliary light is emitted from the flash portion 804, at the same time as pushing down the release button 801 to open a shutter. The lens 805 is located at the front side of the digital camera and made of a focusing lens, a zoom lens, and the like. The lens 805 forms a photographic optical system with a shutter and a diaphragm that are not shown. In addition, behind the lens, an imaging device such as a CCD (Charge Coupled Device) is provided.

The barrel 806 moves a lens position to adjust the focus of the focusing lens, the zoom lens, and the like. In shooting, the barrel 806 is slid out to move the lens 805 forward. Further, when carrying the digital camera, the lens 805 is moved backward to be compact. Note that a structure is employed in this embodiment, in which the subject can be photographed by zoom by sliding out the barrel 806; however, the present invention is not limited to this structure, and a structure may also be employed for the digital camera, in which shooting can be performed by zoom without sliding out the barrel 806 with the use of a structure of a photographic optical system inside the chassis 807.

The eyepiece finder 811 is located in the upper position on the backside of the digital camera for looking there through in checking a shooting range and the focus point. The operation buttons 813 are each a button for various functions provided on the backside of the digital camera, which includes a set up button, a menu button, a display button, a functional button, a selecting button, and the like.

When the photoelectric conversion device of the present invention is incorporated in the camera shown in FIGS. 17A and 17B, the photoelectric conversion device can detect whether light exists or not and light intensity. Accordingly, exposure adjustment or the like of a camera can be performed. In addition, the photoelectric conversion device of the present invention can also be applied to other electronic devices such as a projection TV and a navigation system.

In addition, the photoelectric conversion device of the present invention is not limited to the above but can be used for equipment that requires light detection, for example, a facsimile apparatus, a vending machine, or the like.

Note that this embodiment can be combined with other embodiment modes, if necessary.

According to the present invention, it is possible to provide a photoelectric conversion device, where variation is reduced and characteristics are improved, and a semiconductor device having the photoelectric conversion device.

The present application is based on Japanese Patent Application serial No. 2006-065601 filed on Mar. 10, 2006 in Japanese Patent Office, the entire contents of which are hereby incorporated by reference.

What is claimed is:

1. A semiconductor device comprising:
a light-transmitting substrate;
a transistor over the substrate, the transistor comprising a source, a drain, a gate electrode, and a channel portion;
a color filter over the substrate;
a photoelectric conversion layer over the substrate, the photoelectric conversion layer including a first semiconductor layer of one conductivity type, a second semiconductor layer, and a third semiconductor layer of an opposite conductivity type from that of the first semiconductor layer;
an insulating layer interposed between the color filter and the photoelectric conversion layer;
an electrically conductive light-shielding layer overlapping with an end portion of the photoelectric conversion layer, and in electrical contact with the photoelectric conversion layer and one of the source and the drain of the transistor; and
another electrically conductive light-shielding layer interposed between the substrate and a second end portion of the photoelectric conversion layer, and made from a same material as the gate electrode of the transistor.

2. The semiconductor device according to claim 1, wherein each of the first semiconductor layer, the second semiconductor layer, and the third semiconductor layer are an amorphous semiconductor layer or a semi-amorphous semiconductor layer.

3. The semiconductor device according to claim 1, wherein the insulating layer is formed of an organic resin insulating material, an inorganic insulating material, or a stacked layer of an organic insulating material and an inorganic insulating material.

4. A semiconductor device according to claim 1, further comprising another photoelectric conversion layer overlapping with the color filter.

5. An electronic device to which is applied the semiconductor device according to claim 1.

6. The semiconductor device according to claim 1, wherein each of the first semiconductor layer, the second semiconductor layer, and the third semiconductor layer are an amorphous semiconductor layer or a semi-amorphous semiconductor layer.

7. The semiconductor device according to claim 1, wherein the insulating layer is formed of an organic resin insulating material, an inorganic insulating material, or a stacked layer of an organic insulating material and an inorganic insulating material.

8. An electronic device to which is applied the semiconductor device according to claim 1.

9. A semiconductor device comprising:
a light-transmitting substrate;
a transistor over the substrate, the transistor comprising a source, a drain, a gate electrode, and a channel portion;
a color filter over the substrate;
an insulating layer over the transistor and the color filter;
a photoelectric conversion layer over the insulating layer, the photoelectric conversion layer including a first semiconductor layer of one conductivity type, a second semiconductor layer, and a third semiconductor layer of an opposite conductivity type from that of the first semiconductor layer; and
an electrically conductive light-shielding layer overlapping with an end portion of the photoelectric conversion layer, and in electrical contact with the photoelectric conversion layer and one of the source and the drain of the transistor.

10. A semiconductor device according to claim 9, further comprising another light-shielding layer interposed between the substrate and another end portion of the photoelectric conversion layer.

11. A semiconductor device according to claim 10, wherein the other light-shielding layer is made from a same layer as the light-shielding layer.

12. A semiconductor device according to claim 9, further comprising another light-shielding layer interposed between the substrate and another end portion of the photoelectric conversion layer, and made from a same material as the gate electrode of the transistor.

13. A semiconductor device according to claim 9, wherein the light-shielding layer is made from a same layer as a wiring electrically connected to one of the source and the drain of the transistor.

14. The semiconductor device according to claim 9, wherein each of the first semiconductor layer, the second semiconductor layer, and the third semiconductor layer are an amorphous semiconductor layer or a semi-amorphous semiconductor layer.

15. The semiconductor device according to claim 9, wherein the insulating layer is formed of an inorganic insulating material.

16. A semiconductor device according to claim 9, further comprising another photoelectric conversion layer overlapping with the color filter.

17. An electronic device to which is applied the semiconductor device according to claim 9.

18. A semiconductor device comprising:
a light-transmitting substrate;
a transistor over the substrate, the transistor comprising a source, a drain, a gate electrode, and a channel portion;

a color filter over the substrate;

a photoelectric conversion layer over the substrate, the photoelectric conversion layer including a first semiconductor layer of one conductivity type, a second semiconductor layer, and a third semiconductor layer of an opposite conductivity type from that of the first semiconductor layer;

an insulating layer interposed between the color filter and the photoelectric conversion layer;

an electrically conductive light-shielding layer overlapping with an end portion of the photoelectric conversion layer, and in electrical contact with the photoelectric conversion layer and one of the source and the drain of the transistor; and another electrically conductive light-shielding layer interposed between the substrate and a second end portion of the photoelectric conversion layer, and made from a same material as the gate electrode of the transistor, wherein the light-shielding layer is made from a same layer as a wiring electrically connected to one of the source and the drain of the transistor.

* * * * *